(12) United States Patent
Shu et al.

(10) Patent No.: US 9,997,527 B1
(45) Date of Patent: Jun. 12, 2018

(54) METHOD FOR MANUFACTURING EMBEDDED NON-VOLATILE MEMORY

(71) Applicant: TAIWAN SEMICONDUCTOR MANUFACTURING CO., LTD., Hsinchu (TW)

(72) Inventors: Cheng-Bo Shu, Tainan (TW); Tsung-Yu Yang, Tainan (TW); Chung-Jen Huang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/396,886

(22) Filed: Jan. 3, 2017

Related U.S. Application Data

(60) Provisional application No. 62/426,681, filed on Nov. 28, 2016.

(51) Int. Cl.

| | |
|---|---|
| *H01L 21/8234* | (2006.01) |
| *H01L 27/11568* | (2017.01) |
| *H01L 21/762* | (2006.01) |
| *H01L 29/06* | (2006.01) |
| *H01L 29/10* | (2006.01) |
| *H01L 21/768* | (2006.01) |
| *H01L 21/28* | (2006.01) |
| *H01L 27/11573* | (2017.01) |
| *H01L 29/51* | (2006.01) |
| *H01L 29/66* | (2006.01) |

(52) U.S. Cl.
CPC .. *H01L 27/11568* (2013.01); *H01L 21/28282* (2013.01); *H01L 21/76224* (2013.01); *H01L 21/76895* (2013.01); *H01L 27/11573* (2013.01); *H01L 29/0649* (2013.01); *H01L 29/1095* (2013.01); *H01L 29/513* (2013.01); *H01L 29/518* (2013.01); *H01L 29/6656* (2013.01); *H01L 29/66833* (2013.01)

(58) Field of Classification Search
CPC ............... H01L 27/11568; H01L 27/11573
USPC ................................................ 438/275
See application file for complete search history.

(56) References Cited

U.S. PATENT DOCUMENTS

| | | | |
|---|---|---|---|
| 2014/0021526 A1* | 1/2014 | Yao | ............ H01L 27/11558 257/316 |
| 2016/0043136 A1* | 2/2016 | Kim | ............ H01L 27/228 257/295 |

\* cited by examiner

*Primary Examiner* — Anthony Ho
(74) *Attorney, Agent, or Firm* — McClure, Qualey & Rodack, LLP

(57) ABSTRACT

In a method for manufacturing a semiconductor device, a logic well and a high voltage well are respectively formed in second and third regions of a substrate. A first device structure and a second device structure are formed on a first region of the substrate, third and fourth device structures are respectively formed on the logic well and the high voltage well. A first word line Vt, a source side junction, and a second word line Vt are formed adjacent to the first device structure, between the first device structure and the second device structure, and adjacent to the second device structure. The fourth device structure is removed. A source line junction is formed in the source side junction. The third device structure is removed. First word line and second word lines are respectively formed on the first word line Vt and the second word line Vt.

20 Claims, 16 Drawing Sheets

METHOD FOR MANUFACTURING EMBEDDED NON-VOLATILE MEMORY

RELATED APPLICATIONS

This application claims priority to U.S. Provisional Application Ser. No. 62/426,681, filed Nov. 28, 2016, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased.

Super-flash technology has enabled designers to create cost effective and high performance programmable SOC (system on chip) solutions through the use of split-gate flash memory cells. The aggressive scaling of the third generation embedded super-flash (ESF3) memory enables designing flash memories with very high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
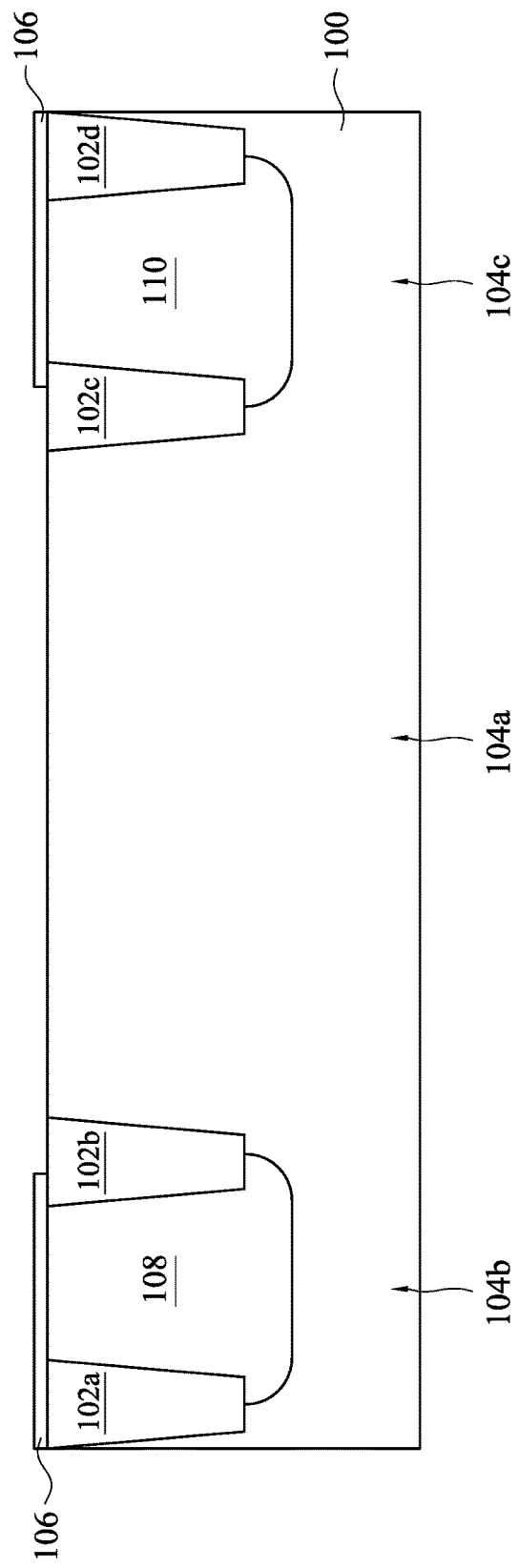
FIG. 1A through FIG. 1O are schematic cross-sectional views of intermediate stages showing a method for manufacturing a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing a 1.5 T ESF3 memory, the 1.5 T ESF3 memory is formed with a polysilicon storage by using a logic first process, i.e. a logic well is formed before a non-volatile memory (NVM) process. The logic well is impacted by the subsequent non-volatile memory process, and resulting in a logic device shift. In another process for manufacturing a 1.5 T ESF3 memory, the 1.5 T ESF3 memory is formed by using a logic last process, i.e. a logic well is formed after a non-volatile memory process, such that the shift of the logic device is decreased. However, in the logic last process, an implantation operation of a low voltage well of a low voltage device is performed through a gate oxide layer of a high voltage device, such that an implant profile of the low voltage well is affected, and resulting in the low voltage device shift. Moreover, the applying of the polysilicon storage induces a triple polysilicon process, and thus increasing complex of the process of manufacturing the 1.5 T ESF3 memory.

Embodiments of the present disclosure are directed to providing a method for manufacturing the semiconductor device, in which after a logic well of a logic device and a high voltage well of a high voltage device are formed, dummy structures are formed to cover the logic well and the high voltage well as device structures are formed, such that the logic well and the high voltage well can be prevented by the dummy structures during subsequent high temperature processes, thereby greatly decreasing shift of the logic device and the high voltage device. Furthermore, an oxide/nitride/oxide (ONO) structure is formed as a trap storage structure of each of device structures, the ONO trap storage structure is thinner than a polysilicon floating gate of a conventional memory, and a control gate of the device structure can be directly disposed on the ONO trap storage structure, such that the thickness of the device structure is reduced. In addition, with the ONO trap storage structure, a triple polysilicon process can be omitted. Thus, compared to the device structure of the conventional memory, each of the device structures has a lower structure topology which is close to that of a logic gate, such that the subsequent patterning processes of the semiconductor device are relatively easy, thereby simplifying a process for manufacturing the semiconductor device and integration of the processes of the semiconductor device and other device, and decreasing process time and reducing process cost.

Figure 1B:
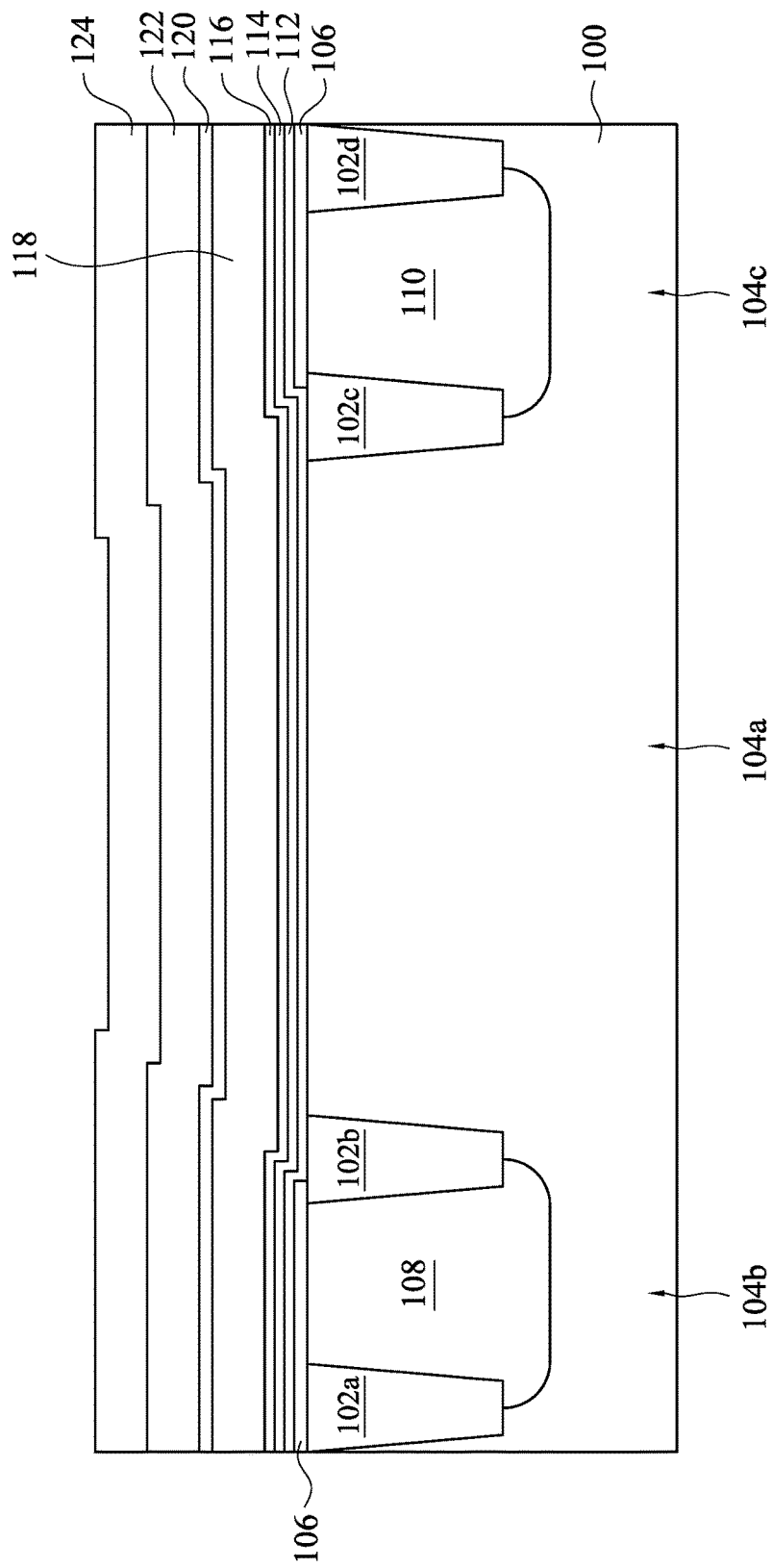
Figure 1C:
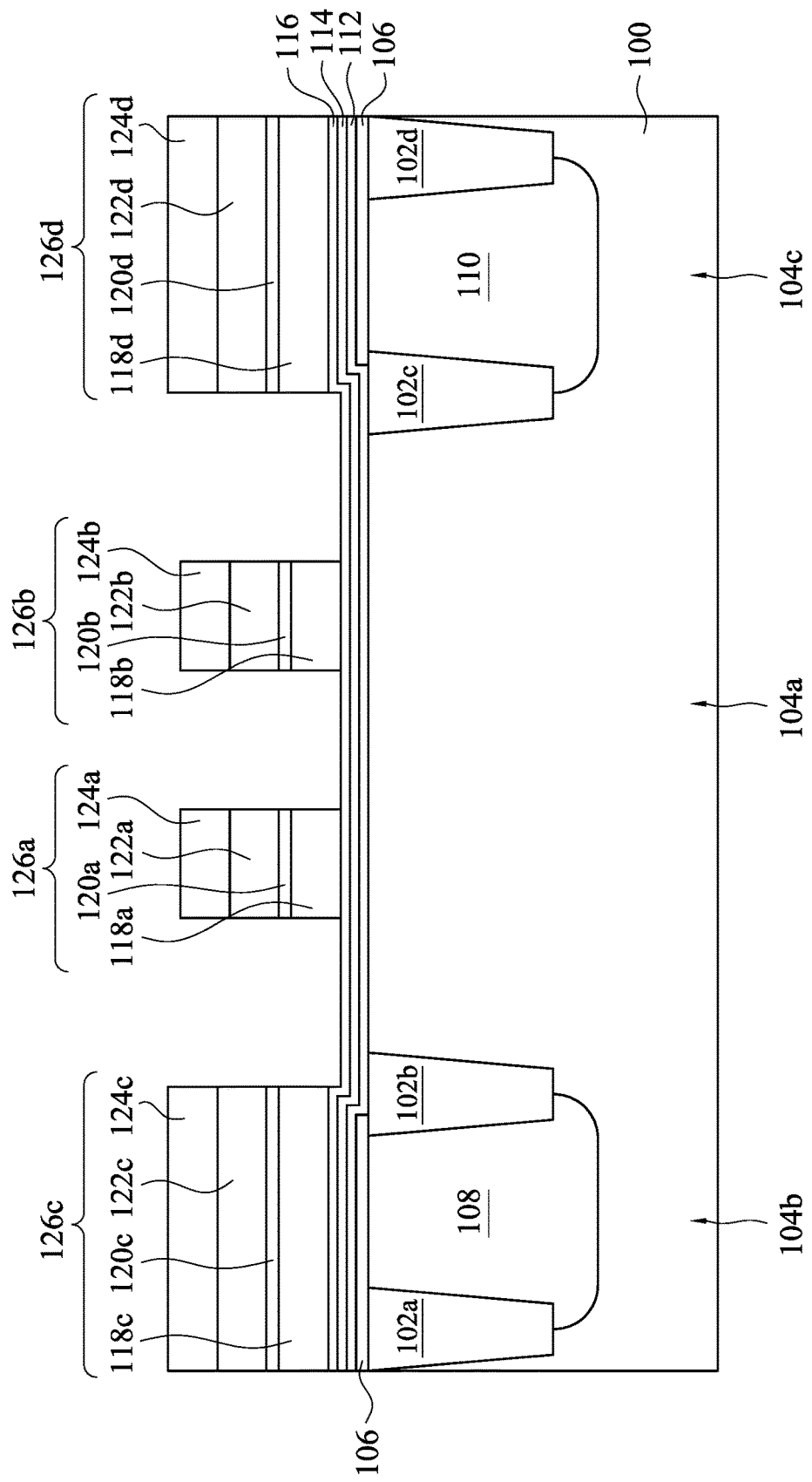
Figure 1D:
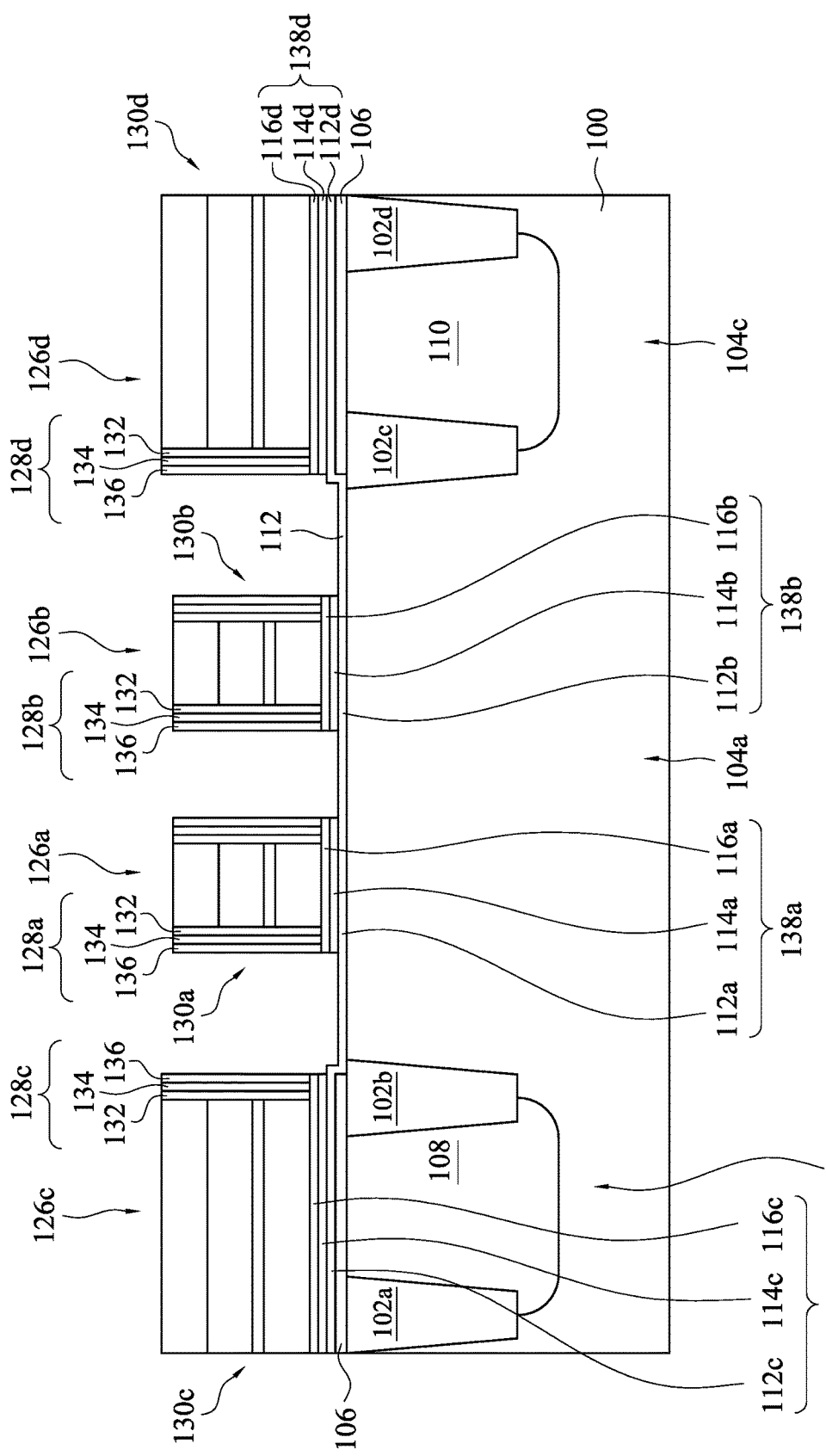
Figure 1E:
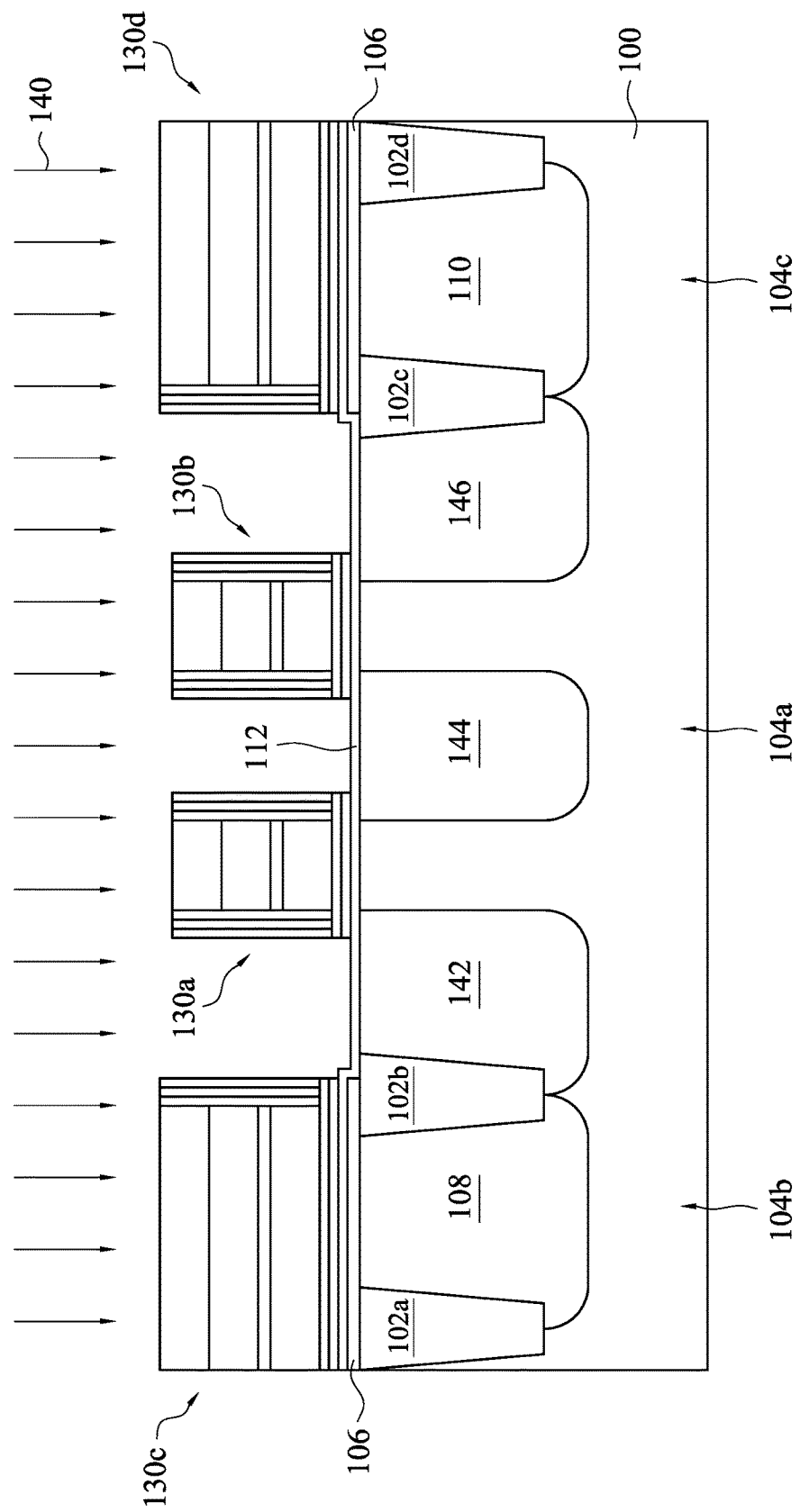
Figure 1F:
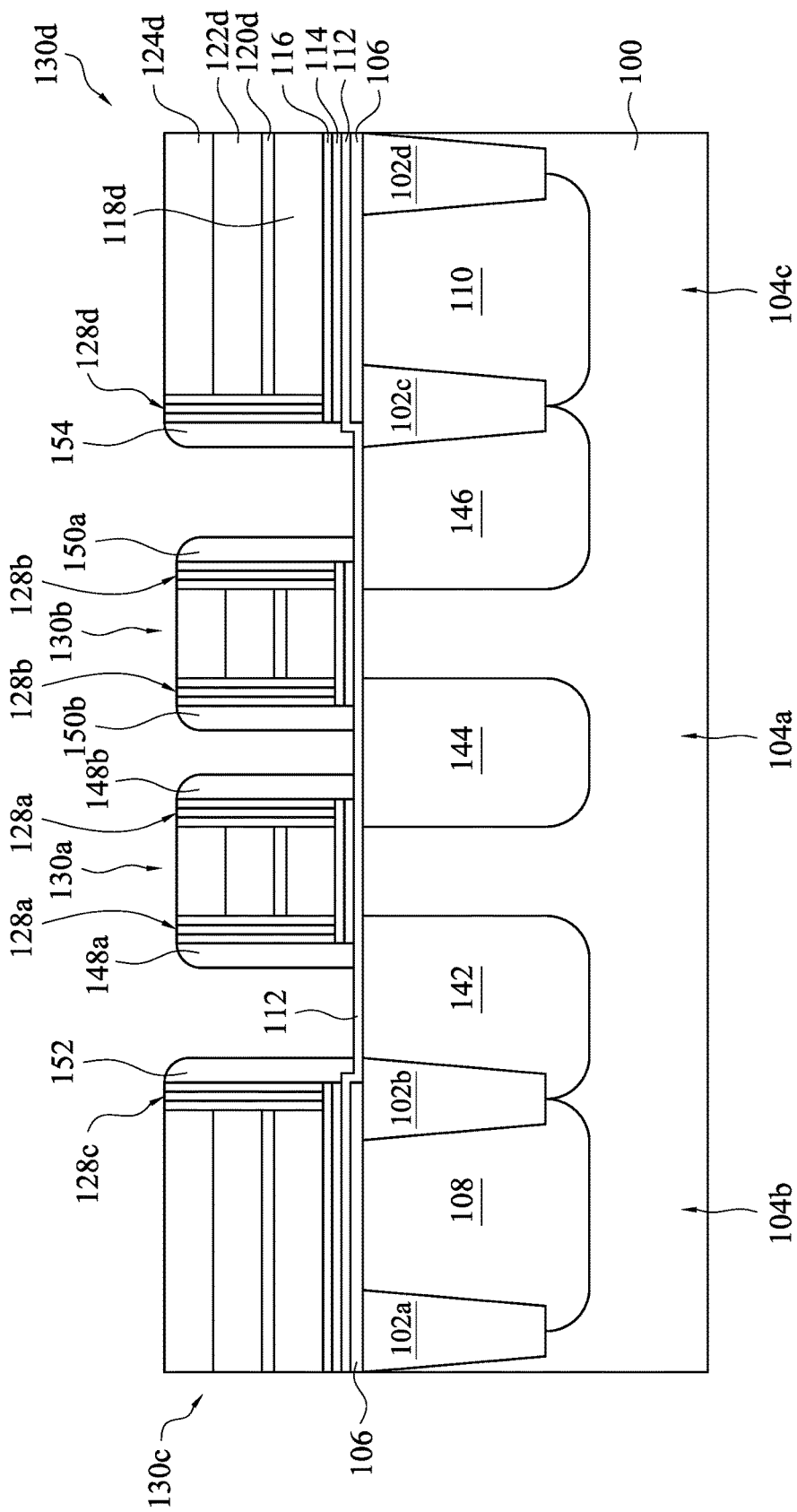
Figure 1G:
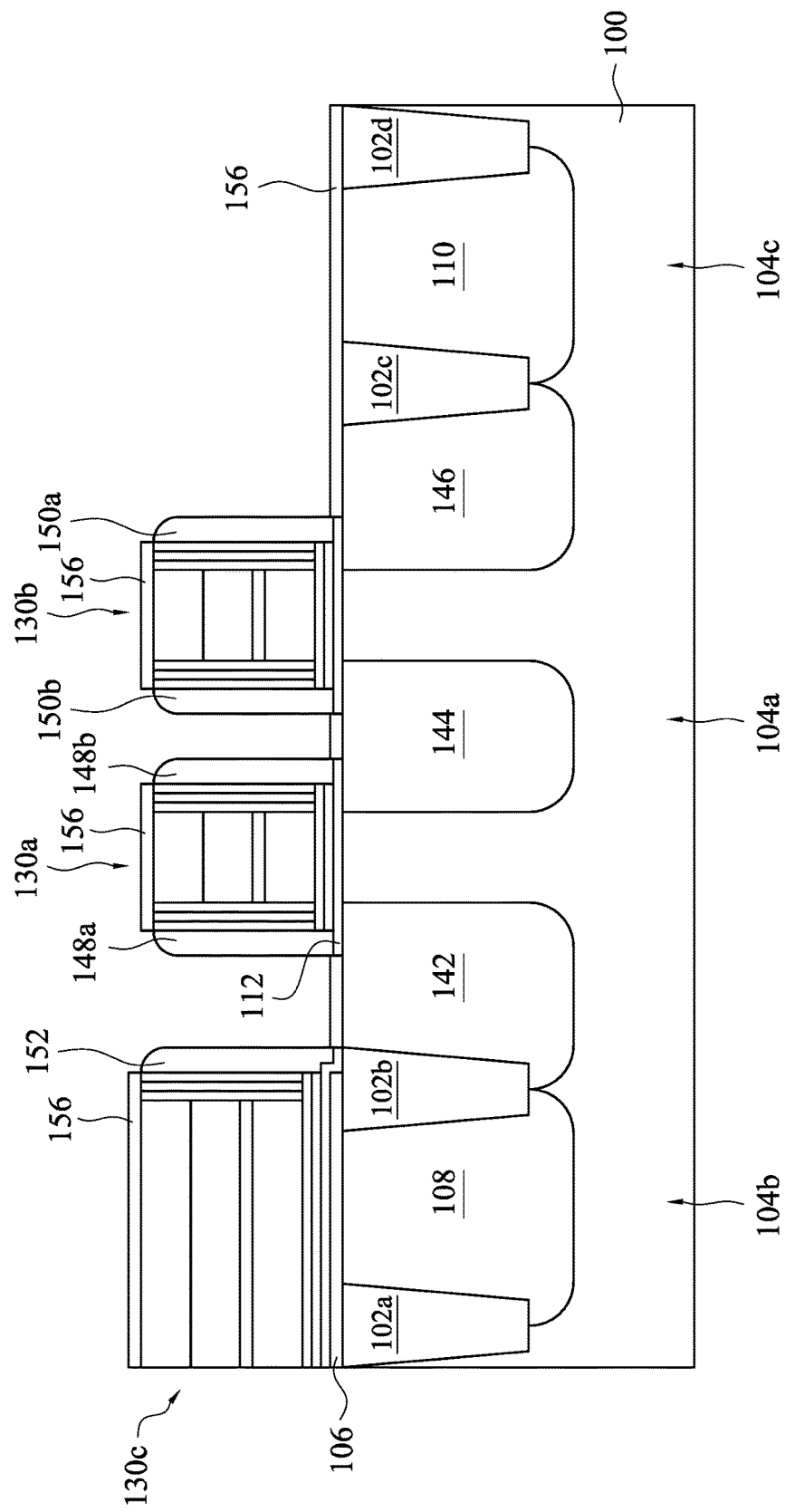
Figure 1H:
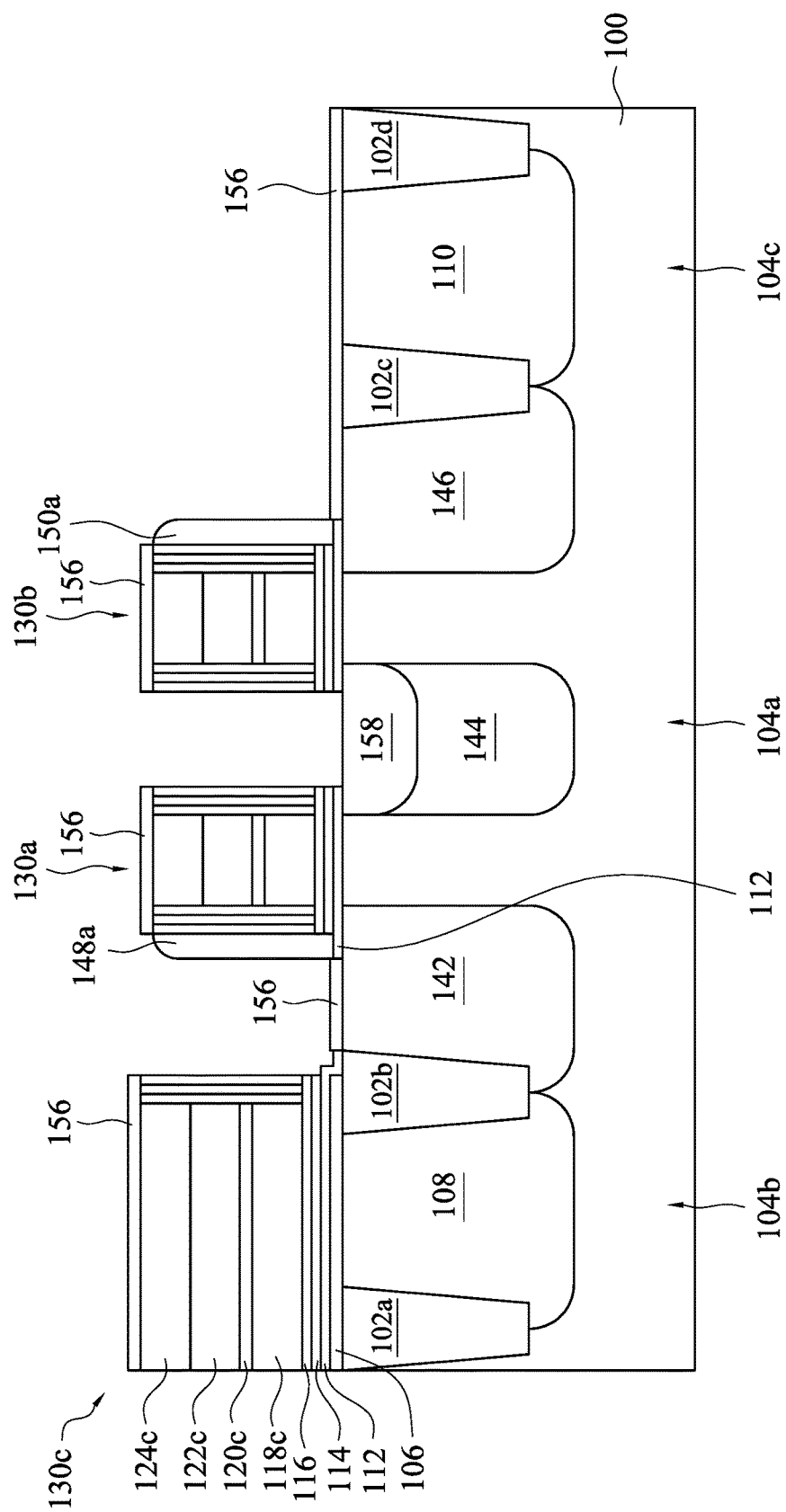
Figure 1I:
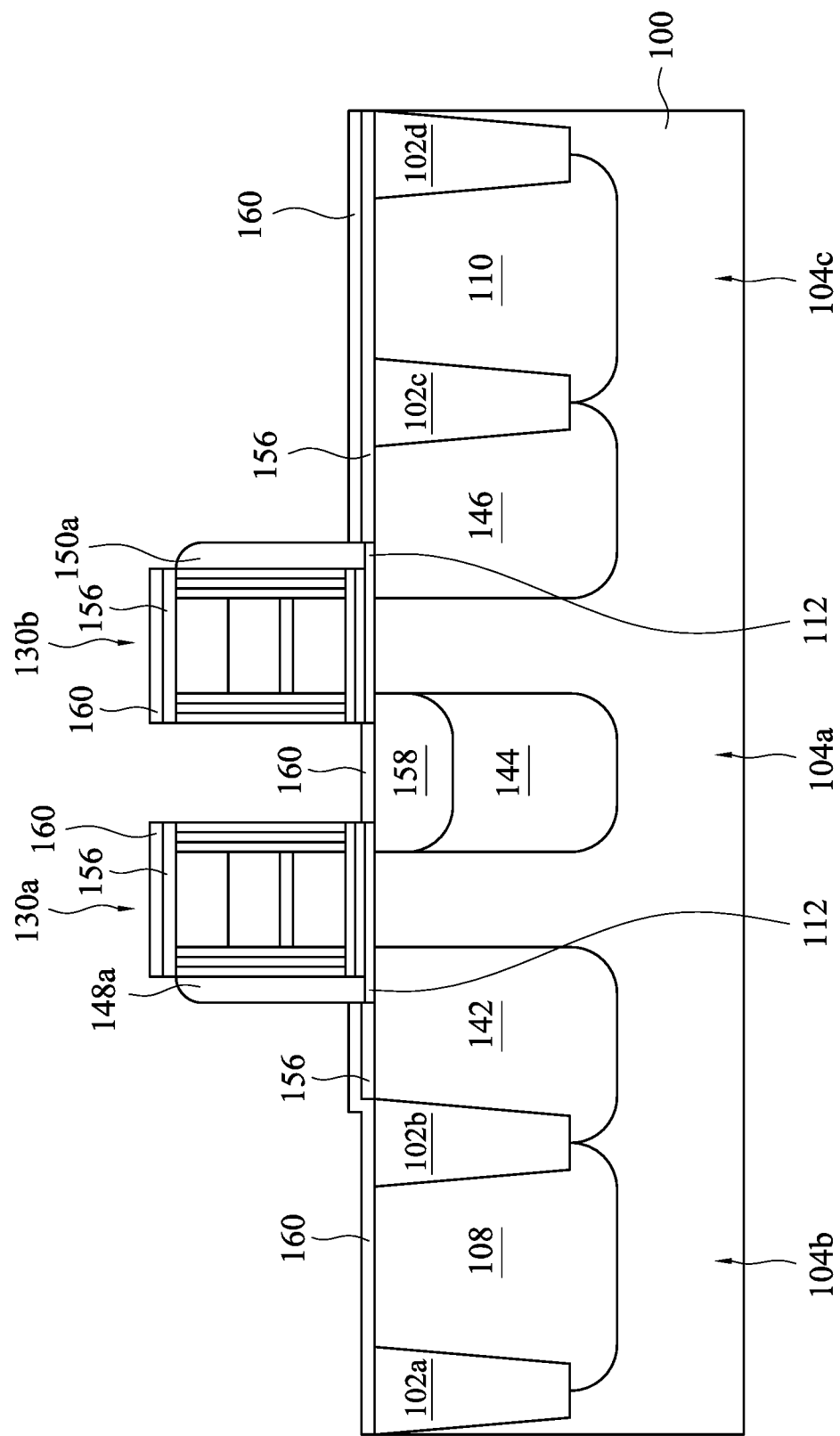
Figure 1J:
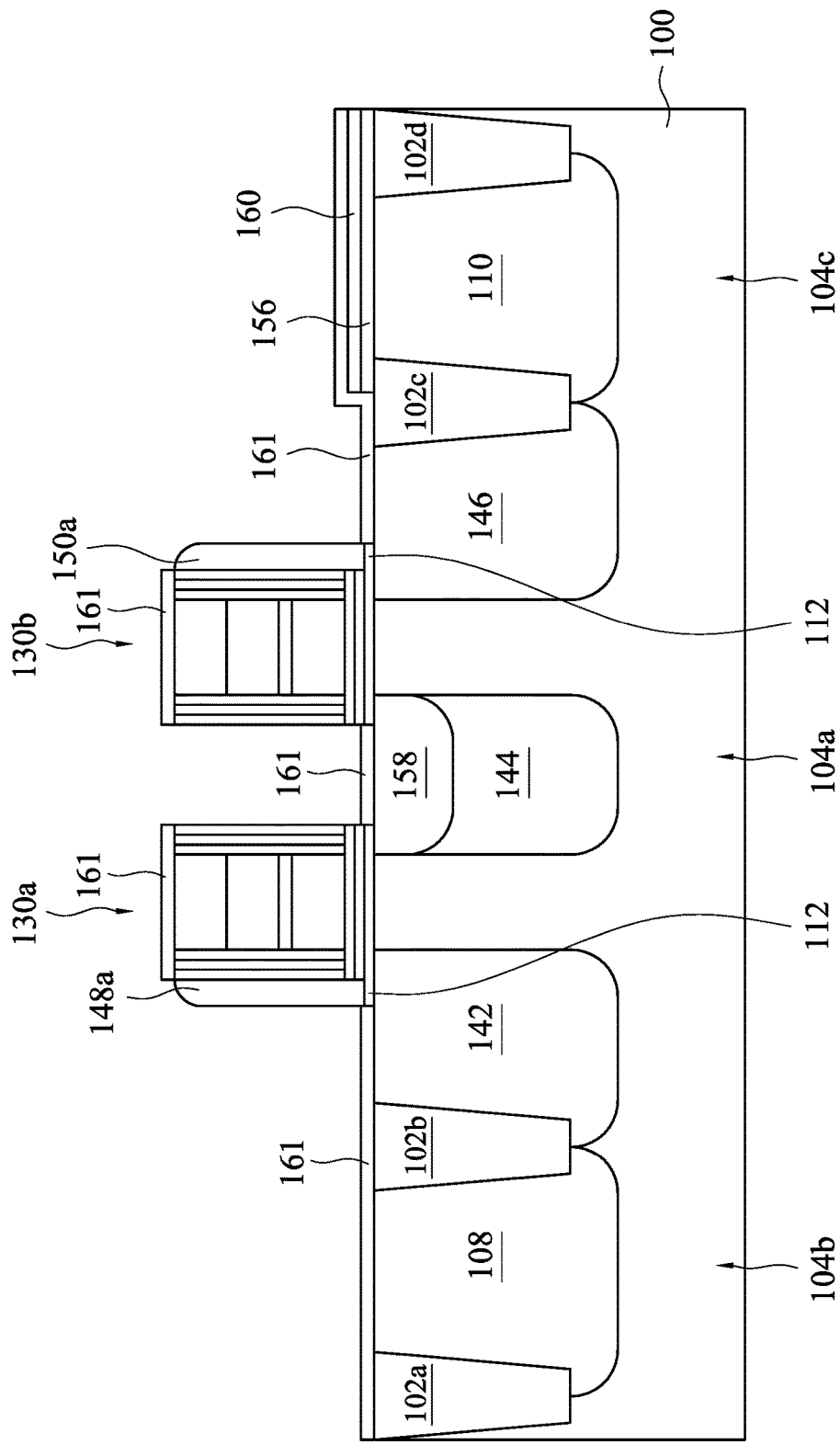
Figure 1K:
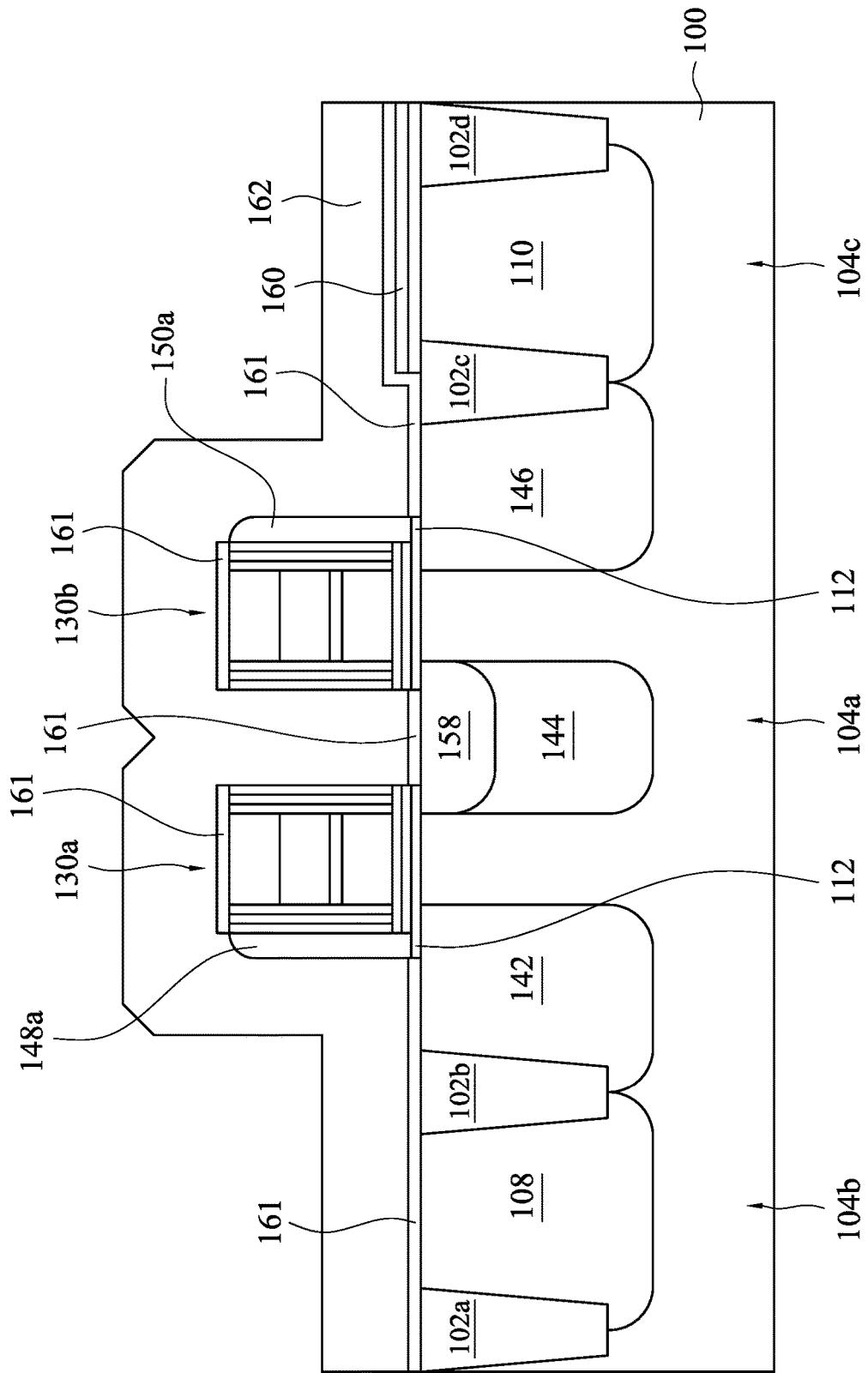
Figure 1L:
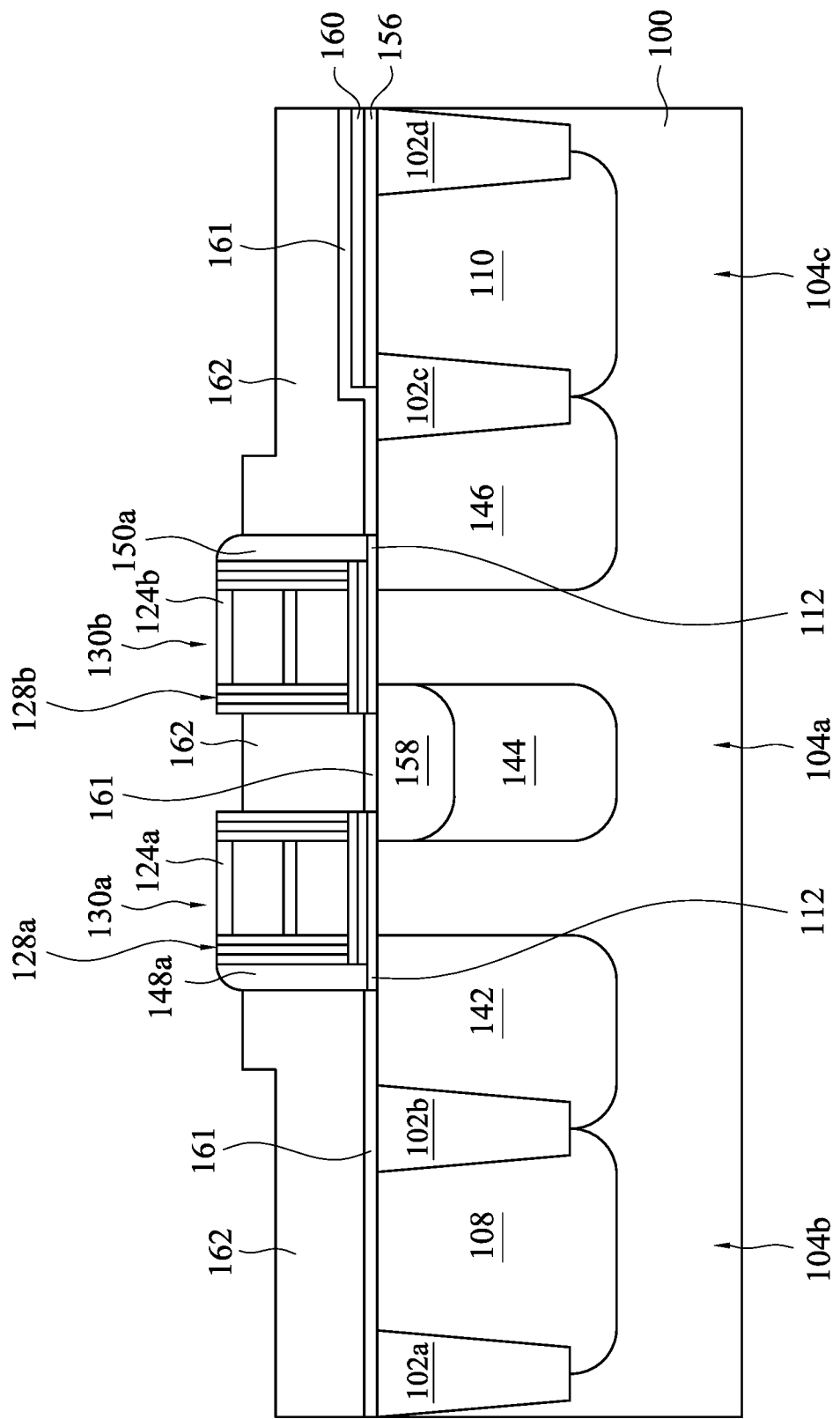
Figure 1M:
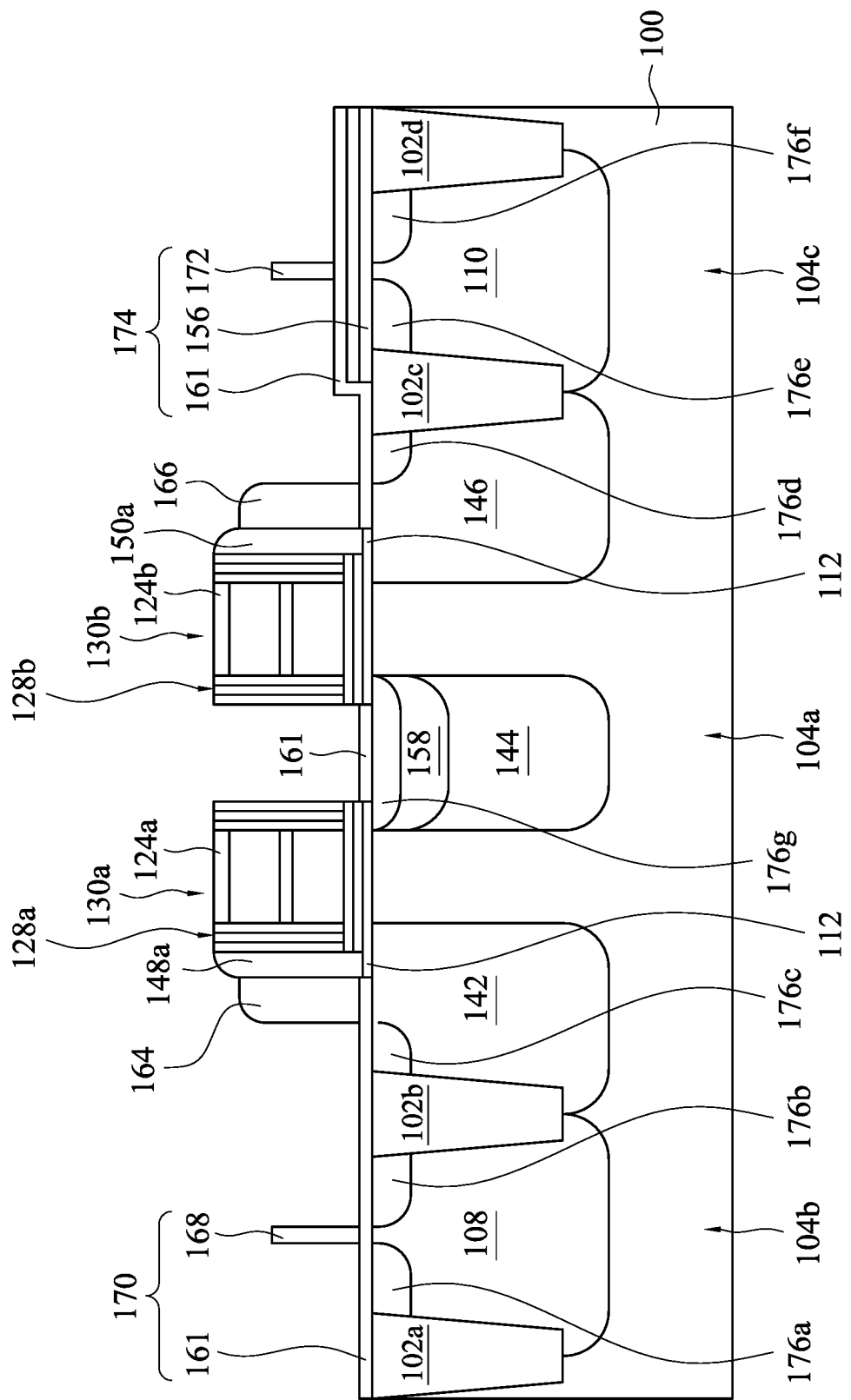
Figure 1N:
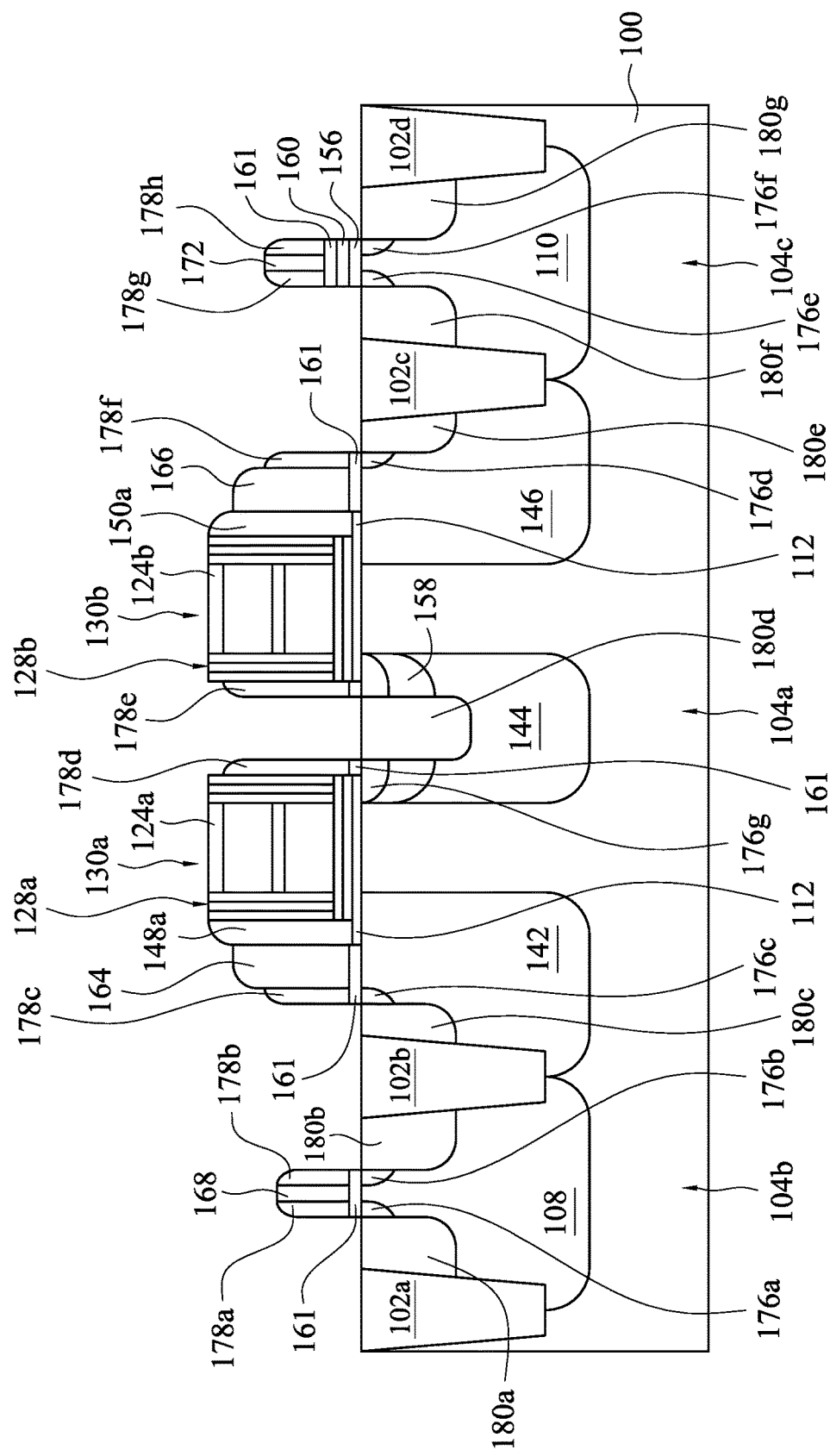
Figure 1O:
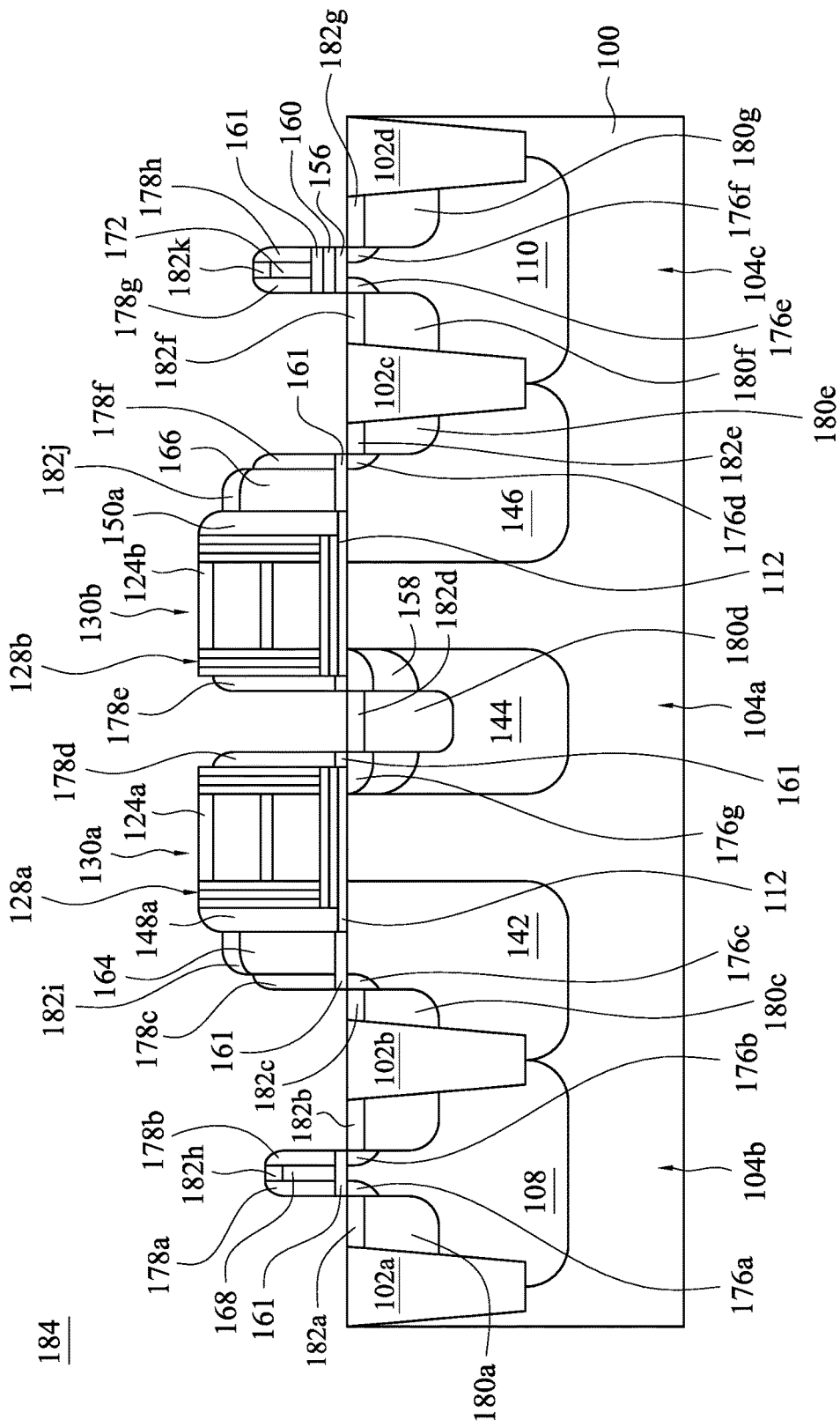

FIG. 1A through FIG. 1O are schematic cross-sectional views of intermediate stages showing a method for manufacturing a semiconductor device in accordance with various embodiments. As shown in FIG. 1A, a substrate 100 is provided. The substrate 100 may be a semiconductor substrate. The substrate 100 may be composed of a single-crystalline semiconductor material or a compound semiconductor material. For example, silicon or germanium may be used as a material forming the substrate 100. In certain examples, the substrate 100 may be a silicon on insulator substrate.

Referring to FIG. 1A again, various isolation structures 102a-102d are formed in the substrate 100. In some examples, in the formation of the isolation structures 102a-102d, a hard mask (not shown) is formed to cover the substrate 100, the hard mask is then patterned by a photolithography process and an etch process, and portions of the substrate 100, which are not covered by the patterned hard mask, are removed to form various trenches in the substrate 100, an isolation material is formed to fill the trenches and to cover the hard mask layer, and then the hard mask and the isolation material over the hard mask layer are removed to form the isolation structures 102a-102d in the substrate 100. The isolation structures 102a-102d formed in the substrate 100 at least define a first region 104a, a second region 104b, and a third region 104c, in which the first region 104a is located between the isolation structures 102b and 102c, the second region 104b is located between the isolation structures 102a and 102b, and the third region 104c is located between the isolation structures 102c and 102d. The isolation structures 102a, 102b, 102c, and 102d may be shallow trench isolation (STI) structures. The isolation material may be formed by using a high density plasma chemical vapor deposition (HDP CVD) method.

After the isolation structures 102a-102d are completed, a pad oxide layer 106 is blanketly formed to cover the substrate 100 by a deposition method or a thermal oxidization method. In some examples, a logic well 108 is formed in the substrate 100 in the second region 104b by performing an implantation process on the second region 104b. Then, a high voltage well 110 is formed in the substrate 100 in the third region 104c by performing an implantation process on the third region 104c. The logic well 108 and the high voltage well 110 are formed using dopants, such as boron and phosphorous. After the logic well 108 and the high voltage well 110 are completed, the portion of the pad oxide layer 106 in the first region 104a is removed by using a photolithography method and an etching method. The remaining portions of the pad oxide layer 106 cover the second region 104b and the third region 104c, as shown in FIG. 1A.

As shown in FIG. 1B, an oxide layer 112, a nitride layer 114, and an oxide layer 116 are formed to cover the substrate 100 in sequence to form an ONO structure. The oxide layer 112, the nitride layer 114, and the oxide layer 116 may be formed by using a deposition method, such as a chemical vapor deposition (CVD) method. The oxide layers 112 and 116 may be formed from silicon oxide, and the nitride layer 114 may be formed from silicon nitride. In some exemplary examples, the oxide layer 112 is formed to have a thickness ranging from about 10 angstrom to about 20 angstrom, the nitride layer 114 is formed to have a thickness ranging from about 100 angstrom to about 150 angstrom, and the oxide layer 116 is formed to have a thickness ranging from about 30 angstrom to about 50 angstrom. A control gate layer 118 is formed to cover the oxide layer 116 by using a deposition method, such as a chemical vapor deposition method. The control gate layer 118 may be formed from polysilicon. In some exemplary examples, the control gate layer 118 is directly deposed on the oxide layer 116.

In some examples, referring to FIG. 1B again, a nitride layer 120, an oxide layer 122, and a nitride layer 124 are formed to cover the control gate layer 118 in sequence to form an NON structure. The nitride layer 120, the oxide layer 122, and the nitride layer 124 form a cap structure. The nitride layer 120, the oxide layer 122, and the nitride layer 124 may be formed by using a deposition method, such as a chemical vapor deposition method. The nitride layers 120 and 124 may be formed from silicon nitride, and the oxide layer 122 may be formed from silicon oxide.

As shown in FIG. 1C, a portion of the nitride layer 124, a portion of the oxide layer 122, a portion of the nitride layer 120, and a portion of the control gate layer 118 are removed by using a photolithography method and an etching method. The remaining portions of the control gate layer 118 disposed on the first region 104a form control gates 118a and 118b respectively, and the remaining portions of the control gate layer 118 disposed on the second region 104b and the third region 104c form control gates 118c and 118d respectively. The remaining portion 120a of the nitride layer 120, the remaining portion 122a of the oxide layer 122, and the remaining portion 124a of the nitride layer 124 are stacked on the control gate 118a to form a stacked structure 126a with the control gate 118a. The remaining portion 120b of the nitride layer 120, the remaining portion 122b of the oxide layer 122, and the remaining portion 124b of the nitride layer 124 are stacked on the control gate 118b to form a stacked structure 126b with the control gate 118b. The remaining portion 120c of the nitride layer 120, the remaining portion 122c of the oxide layer 122, and the remaining portion 124c of the nitride layer 124 are stacked on the control gate 118c to form a stacked structure 126c with the control gate 118c. The remaining portion 120d of the nitride layer 120, the remaining portion 122d of the oxide layer 122, and the remaining portion 124d of the nitride layer 124 are stacked on the control gate 118d to form a stacked structure 126d with the control gate 118d.

As shown in FIG. 1D, spacers 128a-128d are respectively formed on sidewalls of the stacked structures 126a-126d to complete device structures 130a-130d, in which the device structures 130a and 130b are located on the first region 104a, the device structure 130c is located on the second region 104b and covers the logic well 108, and the device structure 130d is located on the third region 104c and covers the high voltage well 110. The device structures 130a-130d are separated from each other. In some examples, each of the spacers 128a-128d is formed to include an oxide layer 132, a nitride layer 134, and an oxide layer 136 stacked on the sidewall of the respective stacked structure 126a, 126b, 126c or 126d in sequence. In some exemplary examples, forming the spacers 128a-128d includes blanketly forming the oxide layer 132, the nitride layer 134, and the oxide layer 136 in sequence to cover the stacked structures 126a-126d and the oxide layer 116, and etching the oxide layer 132, the nitride layer 134, and the oxide layer 136 to remove a portion of the oxide layer 132, a portion of the nitride layer 134, and a portion of the oxide layer 136, so as to form the spacers 128a-128d on the sidewalls of the stacked structure 126a-126d respectively. The oxide layer 132, the nitride layer 134, and the oxide layer 136 may be formed by a deposition method, such as a chemical vapor deposition method. Etching the oxide layer 132, the nitride layer 134, and the oxide layer 136 may be performed by using an anisotropic etching method.

Referring to FIG. 1D again, etching the oxide layer 132, the nitride layer 134, and the oxide layer 136 includes etching the oxide layer 116 and the nitride layer 114. The portion 112a of the oxide layer 112, the remaining portion 114a of the nitride layer 114, and the remaining portion 116a of the oxide layer 116 stacked in sequence form a trap storage structure 138a. The portion 112b of the oxide layer 112, the remaining portion 114b of the nitride layer 114, and the remaining portion 116b of the oxide layer 116 stacked in sequence form a trap storage structure 138b. The portion 112c of the oxide layer 112, the remaining portion 114c of the nitride layer 114, and the remaining portion 116c of the oxide layer 116 stacked in sequence form a trap storage structure 138c. The portion 112d of the oxide layer 112, the remaining portion 114d of the nitride layer 114, and the remaining portion 116d of the oxide layer 116 stacked in sequence form a trap storage structure 138d. The device structures 130a-130d further respectively include the trap storage structures 138a-138d. In addition, each of the device structures 130c and 130d further includes the pad oxide layer 106. The device structures 130c and 130d are dummy device structures, and will be removed in the subsequent process.

In some examples, as shown in FIG. 1E, after the device structures 130a-130d are completed, an implantation process 140 may be performed on the substrate 100 through the oxide layer 112 by using the device structures 130a-130d as mask structures, so as to form a word line threshold voltage (Vt) 142, a source side junction 144, and a word line Vt 146 in the first region 104a. The word line Vt 142 and the word line Vt 146 are respectively adjacent to the device structures 130a and 130b, and the source side junction 144 is located between the device structure 130a and 130b, and the source side junction 144 is opposite to the word line Vt 142 and the word line Vt 146 respectively. The implantation process 140 may be performed using dopants, such as boron and phosphorous.

In some examples, as shown in FIG. 1F, gap oxide layers 148a and 148b are formed on sidewalls of the spacers 128a respectively, gap oxide layers 150a and 150b are formed on sidewalls of the spacers 128b respectively, gap oxide layers 152 are formed on sidewalls of the spacers 128c respectively, and gap oxide layers 154 are formed on sidewalls of the spacers 128d respectively. The gap oxide layer 148b and 150b are disposed on the source side junction 144. In some exemplary examples, forming the gap oxide layers 148a, 148b, 150a, 150b, 152, and 154 includes forming an oxide layer to cover the device structures 130a-130d and the oxide layer 112 on the substrate 100, and etching the oxide layer to remove a portion of the oxide layer to form the gap oxide layers 148a, 148b, 150a, 150b, 152, and 154. The oxide layer may be formed from silicon oxide, and the oxide layer may be formed by a high temperature oxidation (HTO) method. Etching the oxide layer may be performed by an anisotropic etching method. Optionally, in the formation of the gap oxide layers 148a, 148b, 150a, 150b, 152, and 154, a rapid thermal annealing (RTA) process may be performed on the oxide layer between forming the oxide layer and etching the oxide layer.

In some examples, the device structure 130d and the gap oxide layers 154 are removed, as shown in FIG. 1G. In some exemplary examples, referring to FIG. 1F, the gap oxide layers 154 may be firstly removed. The nitride layer 124d, the oxide layer 122d, and the nitride layer 120d are removed by an etching method. The control gate 118d, the oxide layer 116, the nitride layer 114 are removed sequentially by an etching method. Then, the oxide layer 112 and the pad oxide layer 106 are removed by a photolithography method, and an etching method or a dip method.

In some examples, after the device structure 130d and the gap oxide layers 154 are removed, a first gate oxide layer 156 is formed to cover the substrate 100. The first gate oxide layer 156 may be formed to further cover the device structures 130a-130c. In some exemplary examples, the first gate oxide layer 156 may be formed to include a rapid thermal oxide (RTO) layer and a high temperature oxide layer on the rapid thermal oxide layer.

In some examples, as shown in FIG. 1H, the gap oxide layers 148b and 150b, located on the source side junction 144, and the gap oxide layers 152 located on the sidewalls of the device structure 130c are removed. The gap oxide layers 148b, 150b and 152 may be removed by using a photolithography method and an etching method. A source line junction 158 is formed in the source side junction 144 by performing an implantation process on the source side junction 144. After the source line junction 158 is completed, the first gate oxide layer 156 on the source line junction 158 is removed by an etching method, as shown in FIG. 1H. A rapid thermal annealing process may be optionally performed on the first gate oxide layer 156 and the source line junction 158.

As shown in FIG. 1I, the device structure 130c and the first gate oxide layer 156 overlying the device structure 130c are removed. In some exemplary examples, referring to FIG. 1H, the first gate oxide layer 156 overlying the device structure 130c is removed by a dip method. Next, the nitride layer 124c, the oxide layer 122c, and the nitride layer 120c are removed by an etching method, then the control gate 118c, the oxide layer 116, the nitride layer 114 are removed sequentially by an etching method, and then the oxide layer 112 and the pad oxide layer 106 are removed by a photolithography method, and an etching method or a dip method.

In some examples, as shown in FIG. 1I, a second gate oxide layer 160 may be formed on the substrate 100 and the first gate oxide layer 156. The second gate oxide layer 160 may be referred to an IO oxide layer. In some exemplary examples, an operation of forming the second gate oxide layer 160 is performed by a logic dual gate oxide process, and a rapid thermal oxide layer of the second gate oxide layer 160 is firstly formed, and then a high temperature oxide layer of the second gate oxide layer 160 is formed on the rapid thermal oxide layer. A rapid thermal annealing process may be optionally performed on the second gate oxide layer 160.

In some examples, as shown in FIG. 1J, portions of the second gate oxide layer 160 and portions of the first gate oxide layer 156 on the first region 104a, the second region 104b, and a portion of the isolation structure 102c are removed by, for example, a photolithography method, and an etching method or a dip method. Then, referring to FIG. 1J again, a third gate oxide layer 161 is formed to cover the first region 104a, the second region 104b, and the third region 104c. The third gate oxide layer 161 may be referred to a core oxide layer. In some exemplary examples, after removing the portions of the second gate oxide layer 160 and the portions of the first gate oxide layer 156, the word line Vt 142, the word line Vt 146, the device structures 130a and 130b, the source line junction 158, the logic well 108, the isolation structure 102b, and the portion of the isolation structure 102c are exposed. Thus, the third gate oxide layer 161 is formed to cover the remaining portions of the second gate oxide layer 160, the word line Vt 142, the word line Vt 146, the device structures 130a and 130b, the source line junction 158, the logic well 108, the isolation structure 102b, and the portion of the isolation structure 102c. In certain examples, the second region 104b has the second gate oxide layer 160 and the third gate oxide layer 161 sequentially covering thereon. The device including the second gate oxide layer 160 may be referred to a medium voltage (MV) device.

As shown in FIG. 1K, a conductive layer 162 is formed to cover the third gate oxide layer 161, the device structures 130a and 130b, and the gap oxide layers 148a and 150a. In some exemplary examples, the conductive layer 162 may be formed from polysilicon, and may be formed by using a deposition method, such as a chemical vapor deposition method.

As shown in FIG. 1L, a portion of the conductive layer 162 over the device structures 130a and 130b, the spacers 128a and 128b, and the gap oxide layers 148a and 150a is removed by using a photolithography method and an etching method. In the removing of the portion of the conductive layer 162, portions of the nitride layers 124a and 124b, portions of the spacers 128a and 128b, and portions of the gap oxide layers 148a and 150a are removed.

As shown in FIG. 1M, the conductive layer 162 is further etched to form word lines 164 and 166. In some examples, the word line 164 is disposed on the third gate oxide layer 161 over the word line Vt 142 and on one of the spacers 128a of the device structure 130a, in which the gap oxide layer 148a is located between the word line 164 and the spacer 128a; and the word line 166 is disposed on the third gate oxide layer 161 over the word line Vt 146 and on one of the spacers 128b of the device structure 130b, in which the gap oxide layer 150a is located between the word line 166 and the spacer 128b. The word lines 164 and 166 are respectively adjacent to the device structures 130a and 130b. In some exemplary examples, forming of the word lines 164 and 166 further include forming a gate 168 of the logic device 170 on the logic well 108 and a gate 172 of the high voltage device 174 on the high voltage well 110. The logic device 170 mainly includes the gate 168 and the third gate oxide layer 161, and the high voltage device 174 mainly includes the gate 172, the first gate oxide layer 156, the second gate oxide layer 160, and the third gate oxide layer 161.

As shown in FIG. 1E, during the implantation process 140, the device structures 130c and 130d can block the logic well 108 and the high voltage well 110 from the implantation process 140. Furthermore, as shown in FIG. 1F, the logic well 108 and the high voltage well 110 can be prevented by the device structures 130c and 130d during the high temperature process (i.e. the rapid thermal annealing process of the gap oxide layers 148a, 148b, 150a, 150b, 152, and 154). As shown in FIG. 1G, the device structures 130c can further block the logic well 108 from rapid thermal annealing process of the first gate oxide layer 156. Therefore, with the device structures 130c and 130d, the logic well 108 and the high voltage well 110 are well protected, thereby decreasing shift of the logic device 170 and the high voltage device 174.

Referring to FIG. 1M again, in some examples, after the word lines 164 and 166, the gates 168 and 172 are formed, various lightly doped drains 176a-176g are formed in the substrate 100 by using an implantation method. The lightly doped drains 176a and 176b are formed in the logic well 108 at opposite sides of the gate 168 and adjacent to the gate 168, the lightly doped drain 176c is formed in the word line Vt 142 adjacent the word line 164, the lightly doped drain 176d is formed in the word line Vt 146 adjacent the word line 166, the lightly doped drains 176e and 176f are formed in the high voltage well 110 at opposite sides of the gate 172 and adjacent to the gate 172, and the lightly doped drain 176g is formed in the source line junction 158.

Referring to FIG. 1N, in some examples, various spacers 178a-178h are formed on the third gate oxide layer 161. The spacers 178a and 178b are formed on sidewalls of the gate 168, the spacer 178c is formed on a sidewall of the word line 164, the spacer 178d is formed on a sidewall of the device structure 130a and over the lightly doped drain 176g, the spacer 178e is formed on a sidewall of the device structure 130b and over the lightly doped drain 176g, the spacer 178f is formed on a sidewall of the word line 166, and the spacers 178g and 178h are formed on sidewalls of the gate 172. In some exemplary examples, an operation of forming the spacers 178a-178h includes blanketly forming a spacer material layer (not shown) to cover the third gate oxide layer 161, the gates 168 and 172, the device structures 130a and 130b, and the word lines 164 and 166, and performing an etching back process on the spacer material layer to remove a portion of the spacer material layer, a portion of the third gate oxide layer 161, a portion of the second gate oxide layer 160, and a portion of the first gate oxide layer 156, so as to form the spacers 178a-178h.

Referring to FIG. 1N again, after the spacers 178a-178h are completed, a source/drain (S/D) implantation process is performed on the substrate 100 to form S/D regions 180a-180g in the substrate 100. The S/D regions 180a-180g are respectively formed in the lightly doped drains 176a-176g.

Referring to FIG. 1O, in some examples, a silicide process is performed on the S/D regions 180a-180g and the word lines 164 and 166, to form various silicide regions 182a-182g, so as to substantially complete a semiconductor device 184. The silicide regions 182a-182k are respectively formed in the S/D regions 180a-180g, the gate 168, the word line 164, the word line 166, and the gate 172. The semiconductor device 184 may be a 1.5 T third generation embedded super-flash (ESF3) with an ONO trap storage structure.

As shown in FIG. 1C and FIG. 1D, the trap storage structures 138a and 138b are ONO structures, such that each of the trap storage structures 138a and 138b is thinner than a conventional polysilicon floating gate, and the control gates 118a and 118b can be directly stacked on the trap storage structures 138a and 138b. Thus, each of the device structures 130a and 130b has a lower structure topology which is close to that of other devices, such that the subsequent patterning processes of the semiconductor device 184 are relatively easy, thereby simplifying a process for manufacturing the semiconductor device 184 and integration of the processes of the semiconductor device 184 and the other devices, and decreasing process time and reducing process cost.

In addition, by using the ONO structure as the trap storage structure 138a and 138b, the semiconductor device 184 can be programmed using a source side injection (SSI) programming method, and can be erased using a Fowler-Nordheim (FN) erase method, thereby decreasing power consumption of the semiconductor device 184. Furthermore, because the semiconductor device 184 can be programmed by a SSI programming method, the programming operation of the semiconductor device 184 can be performed by a byte mode.

Figure 2:
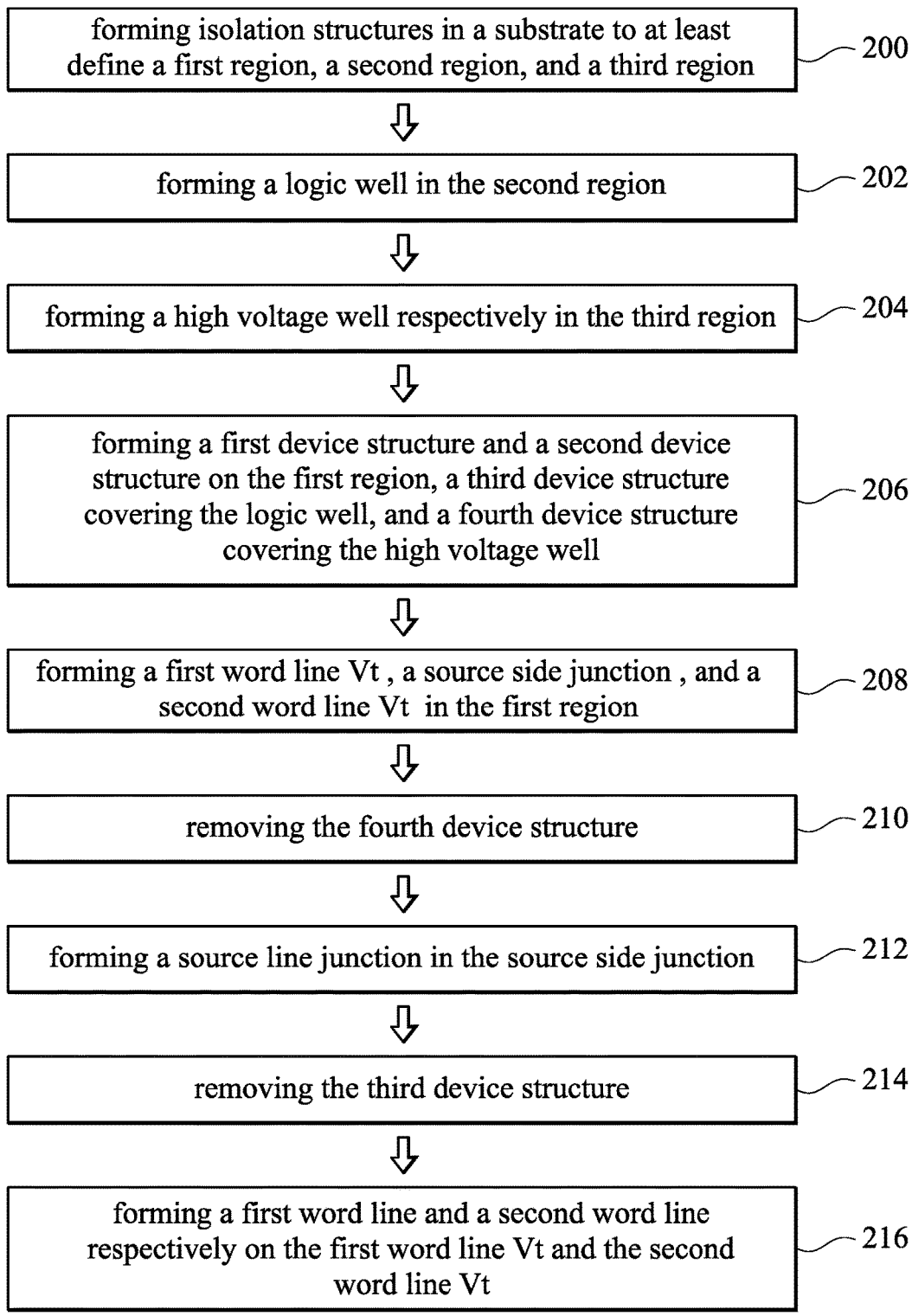
FIG. 2 is a flow chart of a method for manufacturing a semiconductor device in accordance with various embodiments.

Referring to FIG. 2 with FIG. 1A through FIG. 1O, FIG. 2 is a flow chart of a method for manufacturing a semiconductor device in accordance with various embodiments. The method begins at operation 200, where a substrate 100 is provided. The substrate 100 may be a semiconductor substrate, such as a crystalline semiconductor substrate or a compound semiconductor substrate. For example, silicon or germanium may be used as a material forming the substrate 100. In certain examples, the substrate 100 may be a silicon on insulator substrate.

Then, as shown in FIG. 1A, various isolation structures 102a-102d are formed in the substrate 100 to at least define a first region 104a, a second region 104b, and a third region 104c, in which the first region 104a is located between the isolation structures 102b and 102c, the second region 104b is located between the isolation structures 102a and 102b, and the third region 104c is located between the isolation structures 102c and 102d. In some examples, in the formation of the isolation structures 102a-102d, a hard mask (not shown) is formed to cover the substrate 100, the hard mask is then patterned by a photolithography process and an etch process, and portions of the substrate 100, which are not covered by the patterned hard mask, are removed to form various trenches in the substrate 100, an isolation material is formed to fill the trenches and to cover the hard mask layer, and then the hard mask and the isolation material over the hard mask layer are removed to form the isolation structures 102a-102d in the substrate 100. The isolation structures 102a-102d may be shallow trench isolation structures. The isolation material may be formed by using a high density plasma chemical vapor deposition method.

A pad oxide layer 106 is blanketly formed to cover the substrate 100 by a deposition method or a thermal oxidization method. At operation 202, referring to FIG. 1A again, a logic well 108 is formed in the substrate 100 in the second region 104b by performing an implantation process on the second region 104b. At operation 204, a high voltage well 110 is formed in the substrate 100 in the third region 104c by performing an implantation process on the third region 104c. The logic well 108 and the high voltage well 110 are formed using dopants, such as boron and phosphorous. Then, the portion of the pad oxide layer 106 in the first region 104a is removed by using a photolithography method and an etching method. The remaining portions of the pad oxide layer 106 cover the second region 104b and the third region 104c.

At operation 206, as shown in FIG. 1D, device structures 130a and 130b are formed on the first region 104a, a device structure 130c is formed on the second region 104b and covering the logic well 108, and a device structure 130d is formed on the third region 104c and covering the high voltage well 110. In some examples, as shown in FIG. 1B, in the forming of the device structures 130a-130d, an oxide layer 112, a nitride layer 114, and an oxide layer 116 are formed to cover the substrate 100 in sequence to form an ONO structure. The oxide layer 112, the nitride layer 114, and the oxide layer 116 may be formed by using a deposition method. A control gate layer 118 is formed to cover the oxide layer 116 by using a deposition method. In some exemplary examples, the control gate layer 118 is directly deposed on the oxide layer 116. Then, a nitride layer 120, an oxide layer 122, and a nitride layer 124 are formed to cover the control gate layer 118 in sequence to form an NON structure. The nitride layer 120, the oxide layer 122, and the nitride layer 124 may be formed by using a deposition method.

As shown in FIG. 1C, a portion of the nitride layer 124, a portion of the oxide layer 122, a portion of the nitride layer 120, and a portion of the control gate layer 118 are removed by using a photolithography method and an etching method. The remaining portions of the control gate layer 118 disposed on the first region 104a form control gates 118a and 118b respectively, and the remaining portions of the control gate layer 118 disposed on the second region 104b and the third region 104c form control gates 118c and 118d respectively. The remaining portion 120a of the nitride layer 120, the remaining portion 122a of the oxide layer 122, and the remaining portion 124a of the nitride layer 124 are stacked on the control gate 118a to form a stacked structure 126a with the control gate 118a. The remaining portion 120b of the nitride layer 120, the remaining portion 122b of the oxide layer 122, and the remaining portion 124b of the nitride layer 124 are stacked on the control gate 118b to form a stacked structure 126b with the control gate 118b. The remaining portion 120c of the nitride layer 120, the remaining portion 122c of the oxide layer 122, and the remaining portion 124c of the nitride layer 124 are stacked on the control gate 118c to form a stacked structure 126c with the control gate 118c. The remaining portion 120d of the nitride layer 120, the remaining portion 122d of the oxide layer 122, and the remaining portion 124d of the nitride layer 124 are stacked on the control gate 118d to form a stacked structure 126d with the control gate 118d.

As shown in FIG. 1D, spacers 128a-128d are respectively formed on sidewalls of the stacked structures 126a-126d to complete device structures 130a-130d, in which the device structures 130a-130d are separated from each other. In some examples, each of the spacers 128a-128d is formed to include an oxide layer 132, a nitride layer 134, and an oxide layer 136 stacked on the sidewall of the respective stacked structure 126a, 126b, 126c or 126d in sequence. In some exemplary examples, forming the spacers 128a-128d includes blanketly forming the oxide layer 132, the nitride layer 134, and the oxide layer 136 in sequence to cover the stacked structures 126a-126d and the oxide layer 116, and etching the oxide layer 132, the nitride layer 134, and the oxide layer 136 to remove a portion of the oxide layer 132, a portion of the nitride layer 134, and a portion of the oxide layer 136, so as to form the spacers 128a-128d on the sidewalls of the stacked structure 126a-126d respectively. The oxide layer 132, the nitride layer 134, and the oxide layer 136 may be formed by a deposition method. Etching the oxide layer 132, the nitride layer 134, and the oxide layer 136 may be performed by using an anisotropic etching method.

Referring to FIG. 1D again, etching the oxide layer 132, the nitride layer 134, and the oxide layer 136 includes etching the oxide layer 116 and the nitride layer 114. The portion 112a of the oxide layer 112, the remaining portion 114a of the nitride layer 114, and the remaining portion 116a of the oxide layer 116 stacked in sequence form a trap storage structure 138a. The portion 112b of the oxide layer 112, the remaining portion 114b of the nitride layer 114, and the remaining portion 116b of the oxide layer 116 stacked in sequence form a trap storage structure 138b. The portion 112c of the oxide layer 112, the remaining portion 114c of the nitride layer 114, and the remaining portion 116c of the oxide layer 116 stacked in sequence form a trap storage structure 138c. The portion 112d of the oxide layer 112, the remaining portion 114d of the nitride layer 114, and the remaining portion 116d of the oxide layer 116 stacked in sequence form a trap storage structure 138d. The device structures 130a-130d further respectively include the trap storage structures 138a-138d. In addition, each of the device structures 130c and 130d further includes the pad oxide layer 106.

At operation 208, as shown in FIG. 1E, an implantation process 140 may be performed on the substrate 100 through the oxide layer 112 by using the device structures 130a-130d as mask structures, so as to form a word line Vt 142, a source side junction 144, and a word line Vt 146 in the first region 104a. The word line Vt 142 and the word line Vt 146 are respectively adjacent to the device structures 130a and 130b, and the source side junction 144 is located between the device structure 130a and 130b, and the source side junction 144 is opposite to the word line Vt 142 and the word line Vt 146 respectively.

Optionally, as shown in FIG. 1F, gap oxide layers 148a and 148b may be formed on sidewalls of the spacers 128a respectively, gap oxide layers 150a and 150b may be formed on sidewalls of the spacers 128b respectively, gap oxide layers 152 may be formed on sidewalls of the spacers 128c respectively, and gap oxide layers 154 may be formed on sidewalls of the spacers 128d respectively. The gap oxide layer 148b and 150b are disposed on the source side junction 144. In some exemplary examples, forming the gap oxide layers 148a, 148b, 150a, 150b, 152, and 154 includes forming an oxide layer to cover the device structures 130a-130d and the oxide layer 112 on the substrate 100, and etching the oxide layer to remove a portion of the oxide layer to form the gap oxide layers 148a, 148b, 150a, 150b, 152, and 154. The oxide layer may be formed by a high temperature oxidation method. Etching the oxide layer may be performed by an anisotropic etching method. Optionally, in the formation of the gap oxide layers 148a, 148b, 150a, 150b, 152, and 154, a rapid thermal annealing process may be performed on the oxide layer between forming the oxide layer and etching the oxide layer.

At operation 210, as shown in FIG. 1G, the device structure 130d and the gap oxide layers 154 are removed. Referring to FIG. 1F, the gap oxide layers 154 may be firstly removed. The nitride layer 124d, the oxide layer 122d, and the nitride layer 120d are removed by an etching method. Next, the control gate 118d, the oxide layer 116, the nitride layer 114 are removed sequentially by an etching method. Then, the oxide layer 112 and the pad oxide layer 106 are removed by a photolithography method, and an etching method or a dip method. In some exemplary examples, after the device structure 130d and the gap oxide layers 154 are removed, a first gate oxide layer 156 is formed to cover the substrate 100. The first gate oxide layer 156 may be formed to further cover the device structures 130a-130c.

At operation 212, as shown in FIG. 1H, a source line junction 158 is formed in the source side junction 144. In some examples, the gap oxide layers 148b and 150b located on the source side junction 144, and the gap oxide layers 152 located on the sidewalls of the device structure 130c are removed by using a photolithography method and an etching method. Then, the source line junction 158 is formed in the source side junction 144 by performing an implantation process on the source side junction 144. After the source line junction 158 is completed, the first gate oxide layer 156 on the source line junction 158 is removed by an etching method. A rapid thermal annealing process may be optionally performed on the first gate oxide layer 156 and source line junction 158.

At operation 214, as shown in FIG. 1I, the device structure 130c and the first gate oxide layer 156 overlying the device structure 130c are removed. Referring to FIG. 1H, the first gate oxide layer 156 overlying the device structure 130c is removed by a dip method. Next, the nitride layer 124c, the oxide layer 122c, and the nitride layer 120c are removed by an etching method. The control gate 118c, the oxide layer 116, the nitride layer 114 are removed sequentially by an etching method. Then, the oxide layer 112 and the pad oxide layer 106 are removed by a photolithography method, and an etching method or a dip method.

In some examples, as shown in FIG. 1I, a second gate oxide layer 160 may be formed on the substrate 100 and the first gate oxide layer 156. In some exemplary examples, an operation of forming the second gate oxide layer 160 is performed by a logic dual gate oxide process, and a rapid thermal oxide layer of the second gate oxide layer 160 is firstly formed, and then a high temperature oxide layer of the second gate oxide layer 160 is formed on the rapid thermal oxide layer. A rapid thermal annealing process may be optionally performed on the second gate oxide layer 160.

In some examples, as shown in FIG. 1J, portions of the second gate oxide layer 160 and the first gate oxide layer 156 on the first region 104a, the second region 104b, and a portion of the isolation structure 102c are removed by, for example, a photolithography method, and an etching method or a dip method. After removing the portions of the second gate oxide layer 160 and the portions of the first gate oxide layer 156, the word line Vt 142, the word line Vt 146, the device structures 130a and 130b, the source line junction 158, the logic well 108, the isolation structure 102b, and the portion of the isolation structure 102c are exposed. Then, referring to FIG. 1J again, a third gate oxide layer 161 is formed to cover the remaining portions of the second gate oxide layer 160, the word line Vt 142, the word line Vt 146, the device structures 130a and 130b, the source line junction 158, the logic well 108, the isolation structure 102b, and the portion of the isolation structure 102c. In certain examples, the second region 104b has the second gate oxide layer 160 and the third gate oxide layer 161 sequentially covering thereon.

At operation 216, as shown in FIG. 1M, word lines 164 and 166 are formed. In some examples, in the formation of the word lines 164 and 166, a conductive layer 162 is formed to cover the third gate oxide layer 161, the device structures 130a and 130b, and the gap oxide layers 148a and 150a, as shown in FIG. 1K. The conductive layer 162 may be formed by using a deposition method. As shown in FIG. 1L, a portion of the conductive layer 162 over the device structures 130a and 130b, the spacers 128a and 128b, and the gap oxide layers 148a and 150a is removed by using a photolithography method and an etching method. In the removing of the portion of the conductive layer 162, portions of the nitride layers 124a and 124b, portions of the spacers 128a and 128b, and portions of the gap oxide layers 148a and 150a are removed.

Referring to FIG. 1M again, the conductive layer 162 is further etched to form the word lines 164 and 166. In some examples, the word line 164 is disposed on the third gate oxide layer 161 over the word line Vt 142 and on one of the spacers 128a of the device structure 130a, in which the gap oxide layer 148a is located between the word line 164 and the spacer 128a. The word line 166 is disposed on the third gate oxide layer 161 over the word line Vt 146 and on one of the spacers 128b of the device structure 130b, in which the gap oxide layer 150a is located between the word line 166 and the spacer 128b. The word lines 164 and 166 are respectively adjacent to the device structures 130a and 130b. In some exemplary examples, forming of the word lines 164 and 166 further include forming a gate 168 of the logic device 170 on the logic well 108 and a gate 172 of the high voltage device 174 on the high voltage well 110. The logic device 170 mainly includes the gate 168 and the third gate oxide layer 161, and the high voltage device 174 mainly includes the gate 172, the first gate oxide layer 156, the second gate oxide layer 160, and the third gate oxide layer 161.

Various lightly doped drains 176a-176g may be optionally formed in the substrate 100 by using an implantation method. The lightly doped drains 176a and 176b are formed in the logic well 108 at opposite sides of the gate 168 and adjacent to the gate 168, the lightly doped drain 176c is formed in the word line Vt 142 adjacent the word line 164, the lightly doped drain 176d is formed in the word line Vt 146 adjacent the word line 166, the lightly doped drains 176e and 176f are formed in the high voltage well 110 at opposite sides of the gate 172 and adjacent to the gate 172, and the lightly doped drain 176g is formed in the source line junction 158.

Referring to FIG. 1N, various spacers 178a-178h are formed on the third gate oxide layer 161. The spacers 178a and 178b are formed on sidewalls of the gate 168, the spacer 178c is formed on a sidewall of the word line 164, the spacer 178d is formed on a sidewall of the device structure 130a and over the lightly doped drain 176g, the spacer 178e is formed on a sidewall of the device structure 130b and over the lightly doped drain 176g, the spacer 178f is formed on a sidewall of the word line 166, and the spacers 178g and 178h are formed on sidewalls of the gate 172. In some exemplary examples, an operation of forming the spacers 178a-178h includes blanketly forming a spacer material layer to cover the third gate oxide layer 161, the gates 168 and 172, the device structures 130a and 130b, and the word lines 164 and 166, and performing an etching back process on the spacer material layer to remove a portion of the spacer material layer, a portion of the third gate oxide layer 161, a portion of the second gate oxide layer 160, and a portion of the first gate oxide layer 156.

Referring to FIG. 1N again, after the spacers 178a-178h are completed, a S/D implantation process is performed on the substrate 100 to form S/D regions 180a-180g in the substrate 100. The S/D regions 180a-180g are respectively formed in the lightly doped drains 176a-176g. Referring to FIG. 1O, a silicide process is performed on the S/D regions 180a-180g and the word lines 164 and 166, to form various silicide regions 182a-182k, so as to substantially complete a semiconductor device 184. The silicide regions 182a-182k are respectively formed in the S/D regions 180a-180g, the gate 168, the word line 164, the word line 166, and the gate 172.

In accordance with an embodiment, the present disclosure discloses a method for manufacturing a semiconductor device. In this method, various isolation structures are formed in a substrate to at least define a first region, a second region, and a third region. A logic well and a high voltage well are respectively formed in the second region and the third region. A first device structure and a second device structure are formed on the first region, a third device structure is formed to cover the logic well, and a fourth device structure is formed to cover the high voltage well. A first word line Vt, a source side junction, and a second word line Vt are formed in the first region, in which the first word line Vt and the second word line Vt are respectively adjacent to the first device structure and the second device structure, and the source side junction is located between the first device structure and the second device structure, and is opposite to the first word line Vt and the second word line Vt respectively. The fourth device structure is removed. A source line junction is formed in the source side junction. The third device structure is removed. A first word line and a second word line are respectively formed on the first word line Vt adjacent to the first device structure and the second word line Vt adjacent to the second device structure.

In accordance with another embodiment, the present disclosure discloses a method for manufacturing a semiconductor device. In this method, various isolation structures are formed in a substrate to at least define a first region, a second region, and a third region. A logic well and a high voltage well are respectively formed in the second region and the third region. A first device structure and a second device structure are formed on the first region, a third device structure is formed to cover the logic well, and a fourth device structure is formed to cover the high voltage well. Gap oxide layers are formed on sidewalls of the first device structure, the second device structure, the third device structure, and the fourth device structure. The fourth device structure and the gap oxide layers on the sidewalls of the fourth device structure are removed. A first gate oxide layer is formed to cover the substrate. The gap oxide layers on the sidewall of the first device structure adjacent to the second device structure, the sidewall of the second device structure adjacent to the first device structure, and the sidewalls of the third device structure are removed. A source line junction is formed in the substrate between the first device structure and the second device structure. The third device structure is removed. A second gate oxide layer is formed on the substrate and the first gate oxide layer. Portions of the second gate oxide layer and portions of the first gate oxide layer on the first region and the second region are removed. A third gate oxide layer is formed to cover the first region, the second region, and the third region. A first word line and a second word line are respectively formed on the gap oxide layer on the first device structure and the gap oxide layer on the second device structure.

In accordance with yet another embodiment, the present disclosure discloses a method for manufacturing a semiconductor device. In this method, various isolation structures are formed in a substrate to at least define a first region, a second region, and a third region. A logic well and a high voltage well are respectively formed in the second region and the third region. A first device structure and a second device structure are formed on the first region, a third device structure is formed to cover the logic well, and a fourth device structure is formed to cover the high voltage well. In forming each of the first device structure, the second device structure, the third device structure, and the fourth device structure, a trap storage structure is formed on the substrate, a control gate is directly formed on the trap storage structure, a cap structure is formed on the control gate to form a stacked structure, and various spacers are respectively formed on sidewalls of the stacked structure. A first word line Vt, a source side junction, and a second word line Vt are formed in the first region, in which the first word line Vt and the second word line Vt are respectively adjacent to the first device structure and the second device structure, and the source side junction is located between the first device structure and the second device structure, and is opposite to the first word line Vt and the second word line Vt respectively. Various gap oxide layers are formed on sidewalls of the first device structure, the second device structure, the third device structure, and the fourth device structure. The fourth device structure and the gap oxide layers on the sidewalls of the fourth device structure are removed. A first gate oxide layer is formed to cover the substrate. The gap oxide layers on the sidewall of the first device structure adjacent to the second device structure, the sidewall of the second device structure adjacent to the first device structure, and the sidewalls of the third device structure are removed. A source line junction is formed in the substrate between the first device structure and the second device structure. The third device structure is removed. A second gate oxide layer is formed on the substrate and the first gate oxide layer. Portions of the second gate oxide layer and portions of the first gate oxide layer on the first region and the second region are removed. A third gate oxide layer is formed to cover the first region, the second region, and the third region A first word line is formed on the gap oxide layer on the first device structure, a second word line is formed on the gap oxide layer on the second device structure, a gate of a high voltage device is formed on the high voltage well, and a gate of a logic device is formed on the logic well.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    forming a plurality of isolation structures in a substrate to at least define a first region, a second region, and a third region;
    forming a logic well and a high voltage well respectively in the second region and the third region;
    forming a first device structure and a second device structure on the first region, a third device structure covering the logic well, and a fourth device structure covering the high voltage well;
    forming a first implanted area, a source side junction, and a second implanted area in the first region, wherein the first implanted area and the second implanted area are respectively adjacent to the first device structure and the second device structure, and the source side junction is located between the first device structure and the second device structure, and is opposite to the first implanted area and the second implanted area respectively;
    removing the fourth device structure;
    forming a source line junction in the source side junction;
    removing the third device structure; and
    forming a first word line and a second word line respectively on the first implanted area adjacent to the first device structure and the second implanted area adjacent to the second device structure.

2. The method of claim 1, wherein forming each of the first device structure, the second device structure, the third device structure, and the fourth device structure further comprise:
    forming a trap storage structure on the substrate;
    forming a control gate directly on the trap storage structure; and
    forming a cap structure on the control gate to form a stacked structure.

3. The method of claim 2, wherein forming the trap storage structure further comprises:
    forming a first oxide layer on the substrate;
    forming a nitride layer on the first oxide layer; and
    forming a second oxide layer on the nitride layer.

4. The method of claim 2, wherein forming the cap structure further comprises:
    forming a first nitride layer on the control gate;
    forming an oxide layer on the first nitride layer; and
    forming a second nitride layer on the oxide layer.

5. The method of claim 2, wherein forming each of the first device structure and the second device structure further comprises:
    forming a plurality of spacers respectively on a plurality of sidewalls of the stacked structure.

6. The method of claim 5, wherein forming each of the spacers further comprises:
    forming a first oxide layer;
    forming a nitride layer on the first oxide layer; and
    forming a second oxide layer on the nitride layer.

7. The method of claim 1,
    after forming the first implanted area, the source side junction, and the second implanted area, the method further comprising forming a plurality of gap oxide layers on sidewalls of the first device structure and the second device structure; and
    between removing the fourth device structure and forming the source line, the method further comprising removing the gap oxide layers on the source side junction.

8. The method of claim 1,
    between removing the fourth device structure and forming the source line junction, the method further comprising forming a first gate oxide layer to cover the substrate; and
    between removing the third device structure and forming the first word line and the second word line, the method further comprising:
    forming a second gate oxide layer on the substrate and the first gate oxide layer;
    removing portions of the second gate oxide layer and portions of the first gate oxide layer on the first region and the second region to expose the first implanted area, the second implanted area, the first device structure, the second device structure, the source line junction, and the logic well; and
    forming a third gate oxide layer on the second gate oxide layer, the first implanted area, the second implanted area, the first device structure, the second device structure, the source line junction, and the logic well.

9. The method of claim 1, wherein forming the first word line and the second word line comprises forming a gate of a high voltage device on the third region and a gate of a logic device on the second region.

10. A method for manufacturing a semiconductor device, the method comprising:
    forming a plurality of isolation structures in a substrate to at least define a first region, a second region, and a third region;
    forming a logic well and a high voltage well respectively in the second region and the third region;
    forming a first device structure and a second device structure on the first region, a third device structure covering the logic well, and a fourth device structure covering the high voltage well;
    forming a plurality of gap oxide layers on sidewalls of the first device structure, the second device structure, the third device structure, and the fourth device structure;
    removing the fourth device structure and the gap oxide layers on the sidewalls of the fourth device structure;
    forming a first gate oxide layer to cover the substrate;
    removing the gap oxide layers on the sidewall of the first device structure adjacent to the second device structure, the sidewall of the second device structure adjacent to the first device structure, and the sidewalls of the third device structure;
    forming a source line junction in the substrate between the first device structure and the second device structure;
    removing the third device structure;
    forming a second gate oxide layer on the substrate and the first gate oxide layer;
    removing portions of the second gate oxide layer and portions of the first gate oxide layer on the first region and the second region;
    forming a third gate oxide layer to cover the first region, the second region, and the third region; and
    forming a first word line and a second word line respectively on the gap oxide layer on the first device structure and the gap oxide layer on the second device structure.

11. The method of claim 10, wherein forming each of the first device structure, the second device structure, the third device structure, and the fourth device structure further comprises:
  forming a trap storage structure on the substrate;
  forming a control gate directly on the trap storage structure; and
  forming a cap structure on the control gate to form a stacked structure.

12. The method of claim 11, wherein forming the trap storage structure further comprises:
  forming a first oxide layer on the substrate;
  forming a nitride layer on the first oxide layer; and
  forming a second oxide layer on the nitride layer.

13. The method of claim 11, wherein forming the cap structure further comprises:
  forming a first nitride layer on the control gate;
  forming an oxide layer on the first nitride layer; and
  forming a second nitride layer on the oxide layer.

14. The method of claim 11, wherein forming each of the first device structure and the second device structure further comprises:
  forming a plurality of spacers respectively on a plurality of sidewalls of the stacked structure.

15. The method of claim 14, wherein forming each of the spacers further comprises:
  forming a first oxide layer;
  forming a nitride layer on the first oxide layer; and
  forming a second oxide layer on the nitride layer.

16. The method of claim 11, between forming the first device structure, the second device structure, the third device structure, and the fourth device structure, and forming the gap oxide layers, the method further comprising:
  forming a first implanted area, a source side junction, and a second implanted area in the first region, wherein the first implanted area and the second implanted area are respectively adjacent to the first device structure and the second device structure, and the source side junction is located between the first device structure and the second device structure, and is opposite to the first implanted area and the second implanted area respectively.

17. A method for manufacturing a semiconductor device, the method comprising:
  forming a plurality of isolation structures in a substrate to at least define a first region, a second region, and a third region;
  forming a logic well and a high voltage well respectively in the second region and the third region;
  forming a first device structure and a second device structure on the first region, a third device structure covering the logic well, and a fourth device structure covering the high voltage well, wherein forming each of the first device structure, the second device structure, the third device structure, and the fourth device structure further comprises:
  forming a trap storage structure on the substrate;
  forming a control gate directly on the trap storage structure;
  forming a cap structure on the control gate to form a stacked structure; and
  forming a plurality of spacers respectively on a plurality of sidewalls of the stacked structure;
  forming a first implanted area, a source side junction, and a second implanted area in the first region, wherein the first implanted area and the second implanted area are respectively adjacent to the first device structure and the second device structure, and the source side junction is located between the first device structure and the second device structure, and is opposite to the first implanted area and the second implanted area respectively;
  forming a plurality of gap oxide layers on sidewalls of the first device structure, the second device structure, the third device structure, and the fourth device structure;
  removing the fourth device structure and the gap oxide layers on the sidewalls of the fourth device structure;
  forming a first gate oxide layer to cover the substrate;
  removing the gap oxide layers on the sidewall of the first device structure adjacent to the second device structure, the sidewall of the second device structure adjacent to the first device structure, and the sidewalls of the third device structure;
  forming a source line junction in the substrate between the first device structure and the second device structure;
  removing the third device structure;
  forming a second gate oxide layer on the substrate and the first gate oxide layer;
  removing portions of the second gate oxide layer and portions of the first gate oxide layer on the first region and the second region;
  forming a third gate oxide layer to cover the first region, the second region, and the third region; and
  forming a first word line on the gap oxide layer on the first device structure, a second word line on the gap oxide layer on the second device structure, a gate of a high voltage device on the high voltage well, and a gate of a logic device on the logic well.

18. The method of claim 17, wherein forming the trap storage structure further comprises:
  forming a first oxide layer on the substrate;
  forming a nitride layer on the first oxide layer; and
  forming a second oxide layer on the nitride layer.

19. The method of claim 17, wherein forming the cap structure further comprises:
  forming a first nitride layer on the control gate;
  forming an oxide layer on the first nitride layer; and
  forming a second nitride on the oxide layer.

20. The method of claim 17, wherein forming each of the spacers further comprises:
  forming a first oxide layer;
  forming a nitride layer on the first oxide layer; and
  forming a second oxide layer on the nitride layer.

* * * * *